US010976183B2

(12) United States Patent
David et al.

(10) Patent No.: US 10,976,183 B2
(45) Date of Patent: Apr. 13, 2021

(54) MAGNETIC FIELD SENSOR AND METHOD HAVING REDUCED FALSE SWITCHING

(71) Applicant: Allegro MicroSystems, LLC, Manchester, NH (US)

(72) Inventors: Paul A. David, Bow, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 36 days.

(21) Appl. No.: 16/522,810

(22) Filed: Jul. 26, 2019

(65) Prior Publication Data
US 2021/0025735 A1 Jan. 28, 2021

(51) Int. Cl.
*G01D 5/244* (2006.01)

(52) U.S. Cl.
CPC ................. *G01D 5/24428* (2013.01)

(58) Field of Classification Search
None
See application file for complete search history.

(56) References Cited

U.S. PATENT DOCUMENTS

| | | | |
|---|---|---|---|
| 9,719,806 B2 | 8/2017 | Foletto et al. | |
| 10,380,879 B2 | 8/2019 | Haas et al. | |
| 2007/0096723 A1 | 5/2007 | Rieger et al. | |
| 2009/0001965 A1 | 1/2009 | Ausserlechner et al. | |
| 2010/0072988 A1 | 3/2010 | Hammerschmidt et al. | |
| 2013/0304422 A1* | 11/2013 | Ausserlechner | G01P 3/487 |
| | | | 702/189 |
| 2016/0041006 A1 | 2/2016 | Ausserlechner | |
| 2016/0202086 A1 | 7/2016 | Raberg | |
| 2018/0321282 A1* | 11/2018 | Hurwitz | G01R 15/207 |
| 2019/0162784 A1 | 5/2019 | Lassalle-Balier et al. | |

OTHER PUBLICATIONS

U.S. Appl. No. 16/444,347, filed Jun. 18, 2019, Haas et al.
U.S. Appl. No. 16/516,600, filed Jul. 19, 2019, Petrie et al.
Search Report and Written Opinion dated Nov. 19, 2020 for PCT Application No. PCT/US2020/038025; 16 pages.

* cited by examiner

*Primary Examiner* — Jas A Sanghera
(74) *Attorney, Agent, or Firm* — Daly, Crowley, Mofford & Durkee, LLP

(57) ABSTRACT

A magnetic field sensor includes a substrate first and second magnetic field sensing elements, comprising first and second magnetoresistance elements, respectively. The first and second magnetic field sensing elements are responsive to the magnet. At or more positions of the magnet relative to the first and second magnetic field sensing elements while the magnet is stopped moving, at least one of the first magnetic field sensing element or the second magnetic field sensing element is in saturation in response to the magnet. The magnetic field sensor also includes a third magnetic field sensing element proximate to the first and second magnetoresistance elements, the third magnetic field sensing element operable to generate a third magnetic field sensing element signal responsive to the magnet, wherein, at the one or more positions while the magnet is stopped moving, the third magnetic field sensing element is not in saturation in response to the magnet or saturates at a higher magnetic field than the first and second magnetic field sensing elements in response to the magnet.

33 Claims, 12 Drawing Sheets

US 10,976,183 B2

MAGNETIC FIELD SENSOR AND METHOD HAVING REDUCED FALSE SWITCHING

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to magnetic field sensors that generate switching signals and that are operable to reduce or eliminate false switching of the switching signals.

BACKGROUND

Various types of magnetic field sensing elements are known, including Hall Effect elements and magnetoresistance elements. Magnetic field sensors generally include a magnetic field sensing element and other electronic components. Some magnetic field sensors also include a permanent magnet (a hard ferromagnetic object) in a so-called "back biased" arrangement described more fully below. Other magnetic field sensors sense motion of a magnet, for example, a ring magnet having alternating north and south poles.

Magnetic field sensors provide an electrical signal representative of a sensed magnetic field. In some embodiments that have the magnet (back-biased arrangements), the sensed magnetic field is a magnetic field generated by the magnet, in which case, in the presence of a moving ferromagnetic object, the magnetic field generated by the magnet and sensed by the magnetic field sensor varies in accordance with a shape or profile of the moving ferromagnetic object.

In contrast, magnetic field sensors that sense a moving magnet (e.g., a ring magnet with alternating north and south poles) directly sense variations of magnetic field magnitude and direction that result from movement of the magnet.

In some arrangements, the ring magnet (e.g., ferromagnetic ring magnet) can be placed upon a target object, for example, a camshaft in an engine. Thus, it is the rotation of the target object (e.g., camshaft) that is sensed by detection of the moving ring magnet.

Magnetic field sensors that sense movement of a ring magnet are used, for example, in automotive applications to provide information to an engine control processor for ignition timing control, fuel management, anti-lock braking systems, wheel speed sensors, and other operations.

Information provided by the magnetic field sensors that sense movement of a ring magnet to the engine control processor can include, but is not limited to, an absolute angle of rotation of a target object (e.g., a camshaft) as it rotates, a speed of the rotation, and a direction of the rotation.

It is known that some types of magnetoresistance elements, e.g., GMR elements, have a transfer characteristic that saturates at fairly low levels of magnetic field, for example, above about fifty Gauss. In contrast, Hall elements saturate at much higher magnetic fields. AMR elements also saturate at higher fields than GMR elements.

It is also known that many magnetic field sensors employ two of more magnetic field sensing element coupled in a differential arrangement. The differential arrangement generally provides a beneficial effect upon the magnetic field sensor when in the presence of an external (unwanted, e.g., noise) magnetic field. Essentially, the noise signal is received approximately equally by both signals of the differential arrangement, and when the difference of the signals is applied, the noise signal tends to cancel.

However, if one side of a differential arrangement is saturated, then the above cancellation is not achieved, allowed the noise signal to propagate to circuits downstream of the differential arrangement.

A particular example of a situation when one side of a differential arrangement is saturated and the other side is not occurs when a ring magnet is sensed by two (or more) magnetoresistance elements, and the ring magnet stops rotating at a position for which one of the magnetoresistance elements is saturated and the other is not. Such a condition may result in circuits in the magnetic field sensing element processing an external, or noise, signal to which a response is not desirable.

Some magnetic field sensors generate a two-state (i.e., switched) signal. For differential arrangements, a first one of the two states can be achieved when a first one of the two (or more) magnetoresistance elements is proximate to a first pole (e.g., north) of a ring magnet and a second one of the magnetoresistance elements is proximate to a second pole (e.g., south) of the ring magnet. A second one of the two states can be achieved when the opposite situation occurs, e.g., when the second one of the magnetoresistance elements is proximate to the first pole (e.g., north) of the ring magnet the first one of the magnetoresistance elements is proximate to the second pole (e.g., south) of the ring magnet. Thus, it should be apparent that the differential arrangement results in a so called "edge detector" with transitions that occur when the two magnetic field sensing elements surround edges between north and south poles of the ring magnet.

A rate of the transitions of the two-state signal can be indicative of a speed of rotation of the ring magnet.

It should be appreciated that, for the above-described example of the situation when one side of a differential arrangement is saturated and the other side is not, e.g., for particular stopped positions of the ring magnet, the above described two-state signal can toggle back and forth between the two states even when the ring magnet is not moving, but is disturbed by an external, or noise, magnetic field. Such switching can be referred to herein as "false switching."

It would be desirable to provide a magnetic field sensor that uses magnetoresistance elements in a differential arrangement that is responsive to a ring magnet, but that has reduced false switching or no false switching, particularly when the ring magnet is stopped.

SUMMARY

The present invention provides a magnetic field sensor that uses magnetoresistance elements in a differential arrangement that is responsive to a ring magnet, but that has reduced false switching or no false switching, particularly when the ring magnet is stopped.

In accordance with an example useful for understanding an aspect of the present invention, a magnetic field sensor responsive to a magnet operable to move in a predetermined movement and operable to stop moving, includes a substrate, and a first magnetic field sensing element formed upon the substrate, the first magnetic field sensing element comprising a first magnetoresistance element. The first magnetic field sensing element is responsive to the magnet. The magnetic field sensor also includes a second magnetic field sensing element formed upon the substrate, the second magnetic field sensing element comprising a second magnetoresistance element. The second magnetic field sensing element is also responsive to the magnet. At or more positions of the magnet relative to the first and second magnetic field sensing elements, at least one of the first magnetic field sensing element or the second magnetic field sensing element is in saturation in response to the magnet. The magnetic field sensor also includes a third magnetic field sensing element formed upon the substrate and proximate to the first and second magnetoresistance elements, the third magnetic field sensing element operable to generate a third magnetic field sensing element signal responsive to the magnet, wherein, at the one or more positions while the magnet is stopped moving, the third magnetic field sensing element is not in saturation in response to the magnet or saturates at a higher magnetic field than the first and second magnetic field sensing elements in response to the magnet.

In accordance with another example useful for understanding another aspect of the present invention, a method used in a magnetic field sensor responsive to a magnet operable to move in a predetermined movement and operable to stop moving, includes forming a first magnetic field sensing element upon a substrate, the first magnetic field sensing element comprising a first magnetoresistance element. The first magnetic field sensing element is responsive to the magnet. The method also includes forming a second magnetic field sensing element upon the substrate, the second magnetic field sensing element comprising a second magnetoresistance element. The second magnetic field sensing element is also responsive to the magnet. At or more positions of the magnet relative to the first and second magnetic field sensing elements while the magnet is stopped moving, at least one of the first magnetic field sensing element or the second magnetic field sensing element is in saturation in response to the magnet. The method also includes forming a third magnetic field sensing element upon the substrate and proximate to the first and second magnetoresistance elements. The method also includes generating a third magnetic field sensing element signal responsive to the magnet with the third magnetic field sensing element, wherein, at the one or more positions while the magnet is stopped moving, the third magnetic field sensing element is not in saturation in response to the magnet or saturates at a higher magnetic field than the first and second magnetic field sensing elements in response to the magnet.

In accordance with another example useful for understanding another aspect of the present invention, a magnetic field sensor responsive to a magnet operable to move, includes means for generating a first magnetic field sensing element signal responsive to the magnet with a first magnetic field sensing element, the first magnetic field sensing element comprising a first magnetoresistance element. The magnetic field sensor also includes means for generating a second magnetic field sensing element signal responsive to the magnet with a second magnetic field sensing element, the second magnetic field sensing element comprising a second magnetoresistance element. At one or more positions of the magnet relative to the first and second magnetic field sensing elements while the magnet is stopped moving, at least one of the first magnetic field sensing element or the second magnetic field sensing element is in saturation in response to the magnet. The method also includes means for generating a third magnetic field sensing element signal responsive to the magnet with a third magnetic field sensing element, wherein, at the one or more positions, the third magnetic field sensing element is not in saturation in response to the magnet or saturates at a higher magnetic field than the first and second magnetic field sensing elements in response to the magnet.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
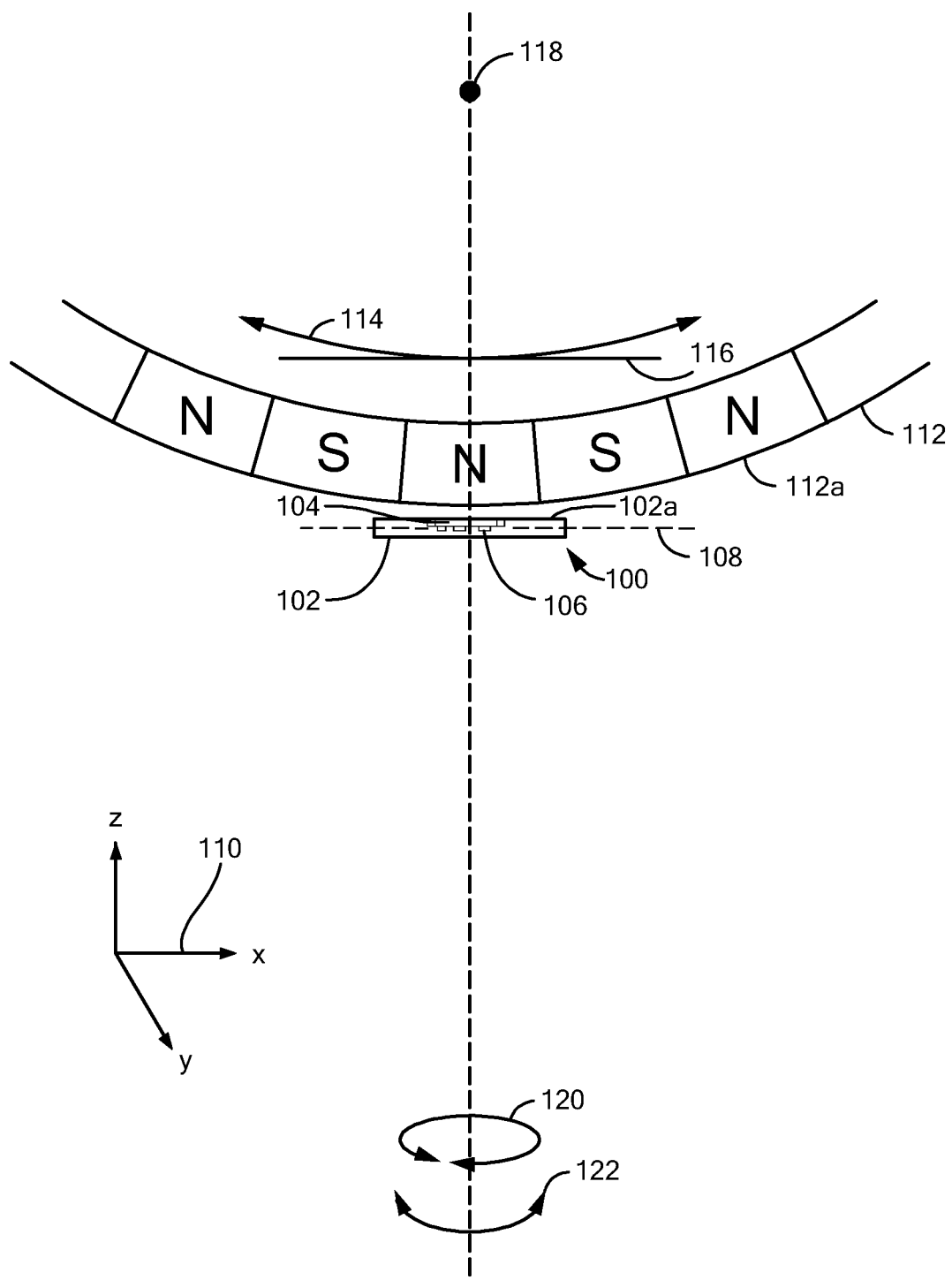
FIG. 1 is a block diagram showing a magnetic field sensor proximate to a ring magnet.

Before describing the present invention, it should be noted that reference is sometimes made herein to magnetic field sensors for sensing magnets having a particular shape (e.g., ring magnets), magnetic field pattern, or magnetization pattern. One of ordinary skill in the art will appreciate, however, that the techniques described herein are applicable to a variety of sizes and shapes of sensed magnets, magnetic field patterns, or magnetization patterns.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

A used herein, the term "Hall element" is used to describe either a planar Hall element or a vertical Hall element.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the terms "line" and "linear" are used to describe either a straight line or a curved line. The line can be described by a function having any order less than infinite.

Referring to FIG. 1, a magnetic field sensor 100 is disposed proximate to a ring magnet 112. The magnetic field sensor 100 includes a substrate 102 having a first major surface 102a. The first major surface 102a extends into and out of the page. Magnetic field sensing elements 104 can be disposed on or under the first surface 102a of the substrate 102. An electronic circuit 106 can also be disposed on or under the first surface 102a of the substrate 102. The electronic circuit can be coupled to the magnetic field sensing elements 104.

The ring magnet 112 can have alternating north and south poles, e.g., 112a.

The ring magnet can be operable to rotate in a direction 114 about a rotation axis 118, in an x-z plane of Cartesian coordinates 110. The first surface 102a can be disposed in the x-y plane.

The magnetic field sensor 100 can be operable over ranges of different orientations of the magnetic field sensor 100. For example, the magnetic field sensor 100 can be rotated in the x-y plane about a line 120 through an angle of approximately ±forty-five degrees. The magnetic field sensor can also be tilted in the x-z plane represented by a line 122 through an angle of approximately ±forty-five degrees.

In some embodiments, the magnetic field sensing elements 104 can include a combination of magnetoresistance elements and a Hall element, a vertical or planar Hall element, described more fully below.

Figure 2:
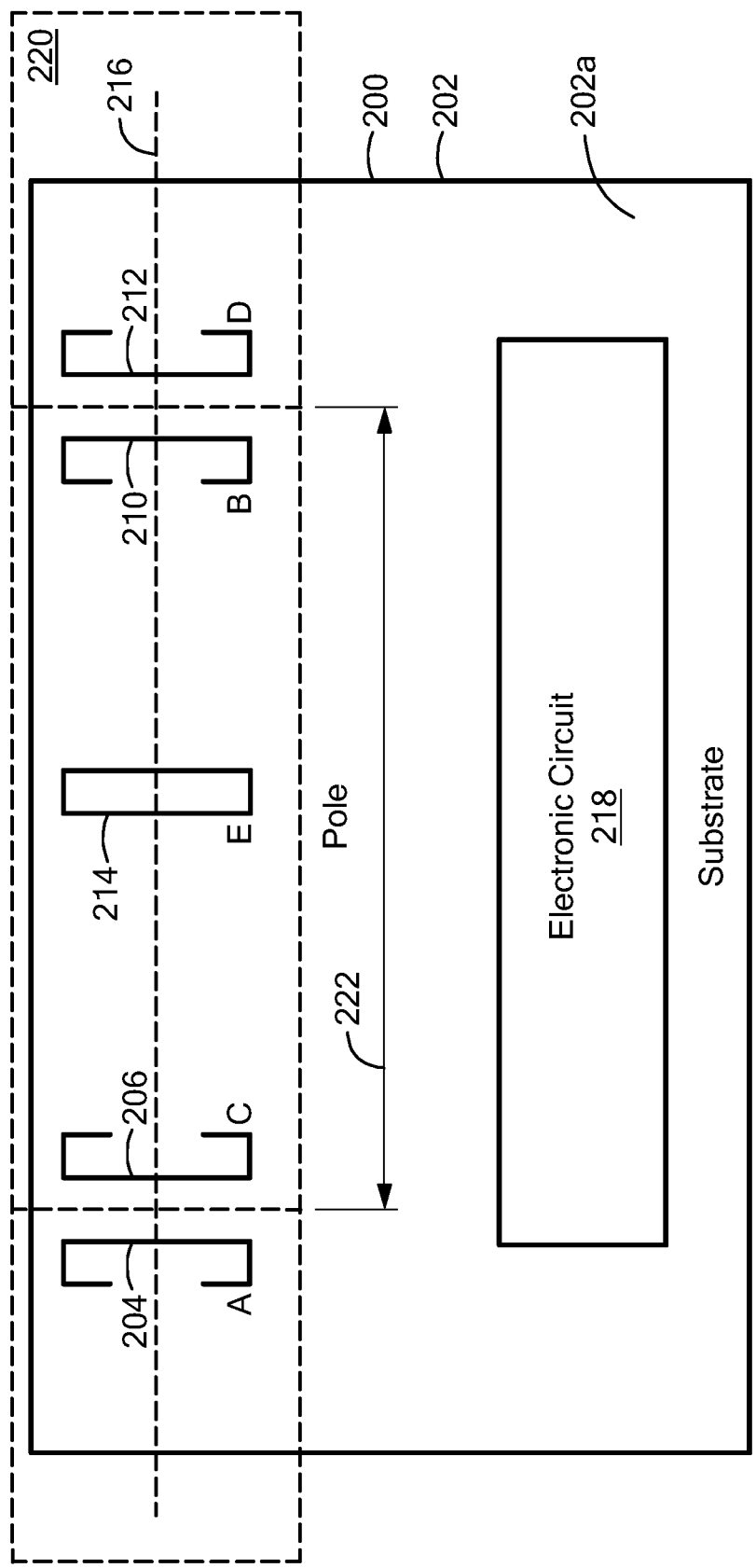
FIG. 2 is a block diagram showing a magnetic field sensor having a vertical Hall element, having four magnetoresistance elements arranged in a differential arrangement, and disposed proximate to a ring magnet.

Referring to FIG. 2, a magnetic field sensor 200 can be the same as or similar to the magnetic field sensor 100 of FIG. 1. The magnetic field sensor 200 can include a substrate 202 having a first major surface 202a. Four magnetoresistance elements 204, 206, 210, 212 can be disposed on or in the first surface 202a. In some embodiments, the four magnetoresistance elements magnetoresistance elements 204, 206, 208, 210 can be GMR elements, which have a high sensitivity, but a fairly low saturation magnetic field, e.g., +/− fifty Gauss.

A vertical Hall element 214 can be disposed between a pair of magnetoresistance elements 204, 206 and a pair of magnetoresistance elements 210, 212. A vertical Hall element is known to saturate at magnetic fields much higher than saturation levels of a GMR element. As described above, the magnetoresistance elements 204, 206, 210, 212 have maximum response axes that are parallel to the first major surface 202a of the substrate 202, and that are aligned with a straight line 216 that is parallel to a tangent to the ring magnet 220. As also described above, the vertical Hall element 214 has a maximum response axis that is parallel to the first major surface 202a of the substrate 202 and that is also aligned with the straight line 216.

A ring magnet 220 can be the same as or similar to the ring magnet 112 of FIG. 1. The ring magnet 220 is shown here in phantom lines for clarity, but can be disposed over the surface 202a. One pole of the ring magnet 220 can have a width 222. A distance between a center of the pair of magnetoresistance elements 204, 206 and the center of the pair of magnetoresistance elements 210, 212 can be approximately the same as the width 222 of a pole of the ring magnet 220.

The magnetic field sensor 200 can also include an electronic circuit 218 that can be coupled to the magnetoresistance elements 204, 206, 210, 212 and also coupled to the vertical Hall element 214.

The magnetoresistance elements 204, 206, 210, 212 are also designated with letters A, C, B, D, respectively. The vertical Hall element is also designated with the letter E. The letters are used in other figures below.

Figure 3:
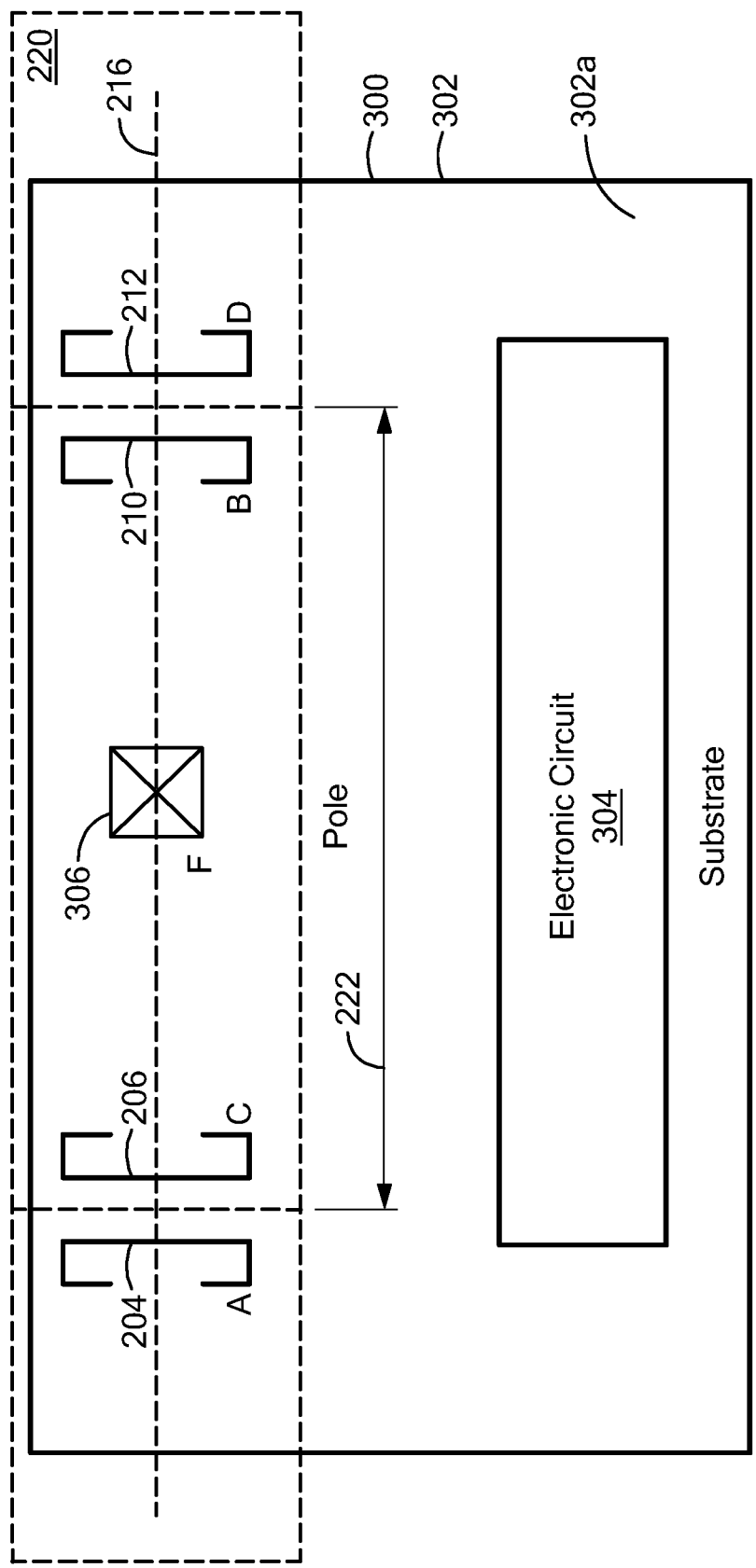
FIG. 3 is a block diagram showing a magnetic field sensor having a horizontal or planar Hall element, having four magnetoresistance elements arranged in a differential arrangement, and disposed proximate to a ring magnet.

Referring now to FIG. 3, in which like elements of FIG. 2 are shown having like reference designations, a magnetic field sensor 300 can include a substrate 302 with a first major surface 302a. Unlike the magnetic field sensor 200 of FIG. 2, the magnetic field sensor 300 can include a planar Hall element 306, also designated with letter F, in place of the vertical Hall element 214 of the magnetic field sensor 200 of FIG. 2. As described above, the planar Hall element 214 has a maximum response axis that is perpendicular to the first major surface 202a of the substrate 202 and that intersects the straight line 216. A planar Hall element is known to saturate at magnetic fields much higher than saturation levels of a GMR element.

The magnetic field sensor 300 can also include an electronic circuit 304 that can be coupled to the magnetoresistance elements 204, 206, 210, 212 and also coupled to the planar Hall element 306.

While a vertical Hall element 214 and a planar Hall element 306 are shown in FIGS. 2 and 3, other types of magnetic field sensing elements can be disposed at the center position. Whatever type of magnetic field sensing element is disposed at the center position can be operable to properly sense magnetic fields at higher levels of magnetic fields than can the magnetoresistance elements 204, 206, 208, 210. In other words, the magnetic field sensing element disposed at the center position can saturate at substantially higher magnetic fields than the outer magnetoresistance elements. AMR is an example of another type of magnetic field sensing element that can be disposed at the center position.

Figure 4:
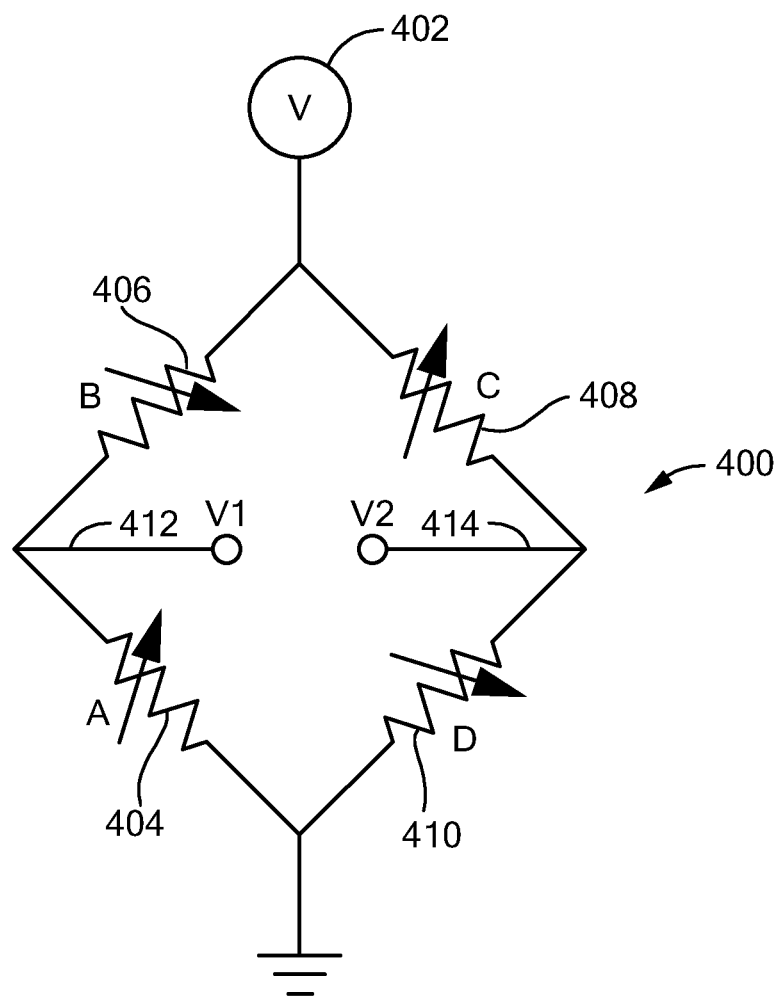
FIG. 4 is a schematic drawing showing for magnetoresistance elements arranged in a differential arrangement.

Referring now to FIG. 4, in some embodiments, four magnetoresistance elements 404, 406, 408, 410 can be coupled in a Wheatstone bridge arrangement 400 between a voltage source 402 and a reference voltage, for example, ground. The four magnetoresistance elements 404, 406, 408, 410 are also identified by letters A, B, C, D, in accordance with similar letter designations for the four magnetoresistance elements 204, 210, 206, 212, respectively, of FIGS. 2 and 3. Thus, the letter designations can be indicative of physical placement of the four magnetoresistance elements 404, 406, 408, 410.

The Wheatstone bridge arrangement 400 can generate a differential voltage 412, 414, also represented as V1, V2. Advantages of differential arrangements are described above. Saturation of magnetoresistance elements is also described above, and can defeat the advantages of a differential arrangement.

While four magnetoresistance elements 404, 406, 408, 410 are shown, in other embodiments, only the two magnetoresistance elements 406, 408 are used and the magnetoresistance elements 404, 410 are replaced with fixed value resistors here and in FIG. 5 below. In still other embodiments, only the two magnetoresistance elements 404, 410 are used and the magnetoresistance elements 406, 408 are replaced with fixed value resistors here and in FIG. 5 below.

Figure 5:
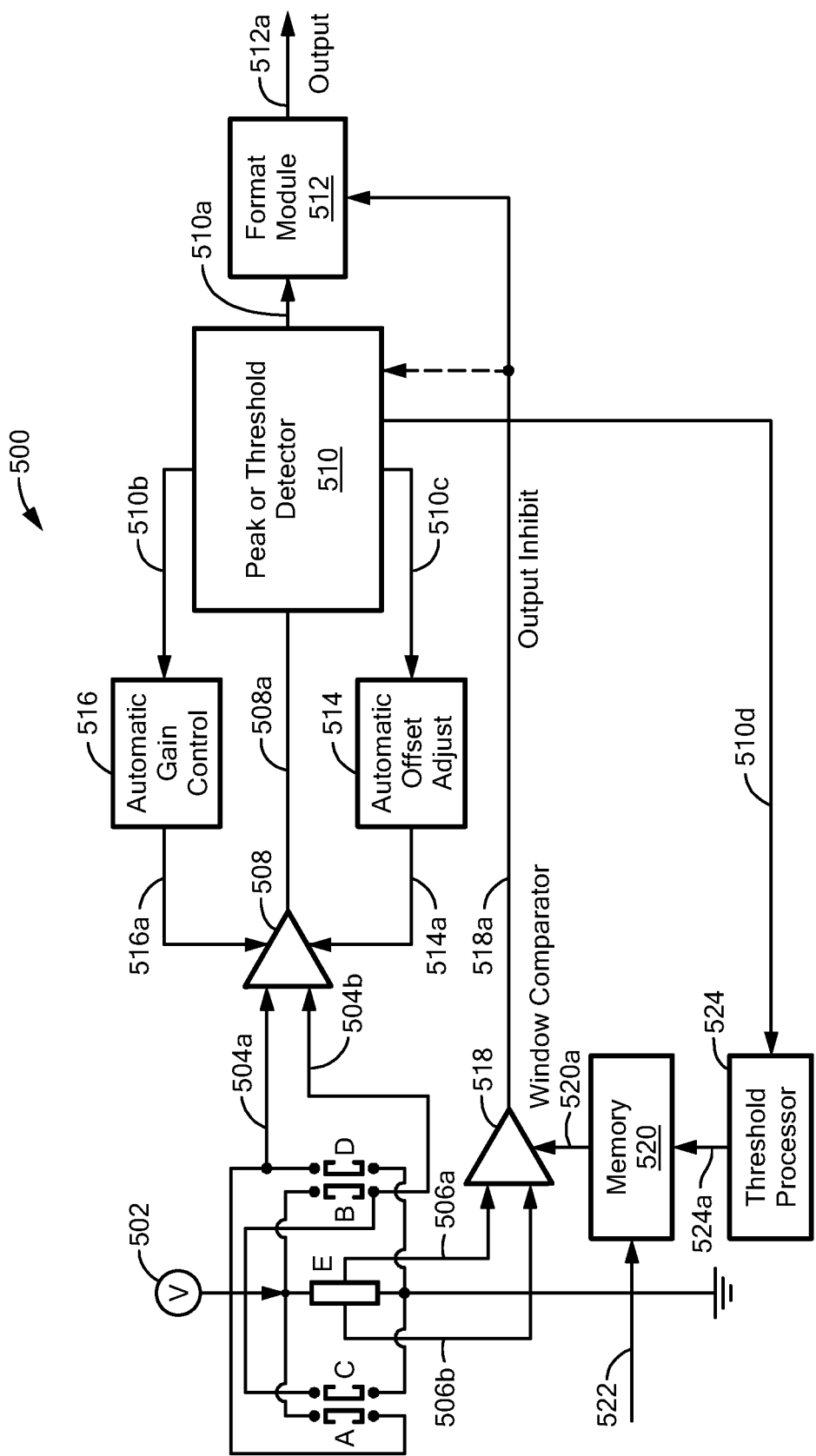
FIG. 5 is a block diagram showing a magnetic field sensor having a vertical Hall element, four magnetoresistance elements, a peak or threshold detector, and circuitry to provide an output signal.

Referring now to FIG. 5, a magnetic field sensor 500 can be the same as or similar to the magnetic field sensor 200 of FIG. 2.

Four magnetoresistance elements, here designated with letters A, C, B, D can be the same as or similar to the magnetoresistance elements 204, 206, 210, 212 of FIG. 2 with the same letter designations. The four magnetoresistance elements A, C, B, D are arranged in a Wheatstone bridge arrangement, which can be the same as or similar to the Wheatstone bridge arrangement 400 of FIG. 4. The four magnetoresistance elements A, C, B, D can generate a differential voltage 504a, 504b, which can be the same as or similar to the differential voltage 412, 414 of FIG. 4.

A difference circuit 508 can receive the differential voltage 504a, 504b and can generate a difference signal 508a. The difference signal 508a is also referred to here as a DIFF signal. The difference circuit 508 can have a gain greater than one, less than one, or one. In other embodiments, the difference circuit 508 is a digital circuit preceded by analog-to-digital converters (not shown).

A peak or threshold detector module 510 can receive the difference signal 508a and can generate a comparison signal 510a. The peak or threshold detector module 510 is described more fully below in conjunction with FIG. 6. Let it suffice here to say that the peak of threshold detector module 510 can be operable to identify one or more thresholds within a peak-to-peak range of the difference signal 508a and can compare the one or more thresholds with the difference signal 508a to generate the comparison signal 510a as a two state signal that changes state when the difference signal 508a crosses the one or more thresholds. It should be apparent that a rate of the change of states of the comparison signal 510a is indicative of a speed of rotation of a ring magnet (e.g., 112 of FIG. 1) proximate to the magnetic field sensor 500.

The comparison signal 510a can be received by a format module 512, which can be operable to generate a formatted output signal 512a. In some embodiments, the formatted output signal 512a can include pulses, for example, forty-five microsecond pulses, for which each pulse is generated upon each transition of the comparison signal 510a. In other embodiments, the formatted output signal 512 has a different format, for example, a SENT format, a PWM format, or an I2C format.

The peak or threshold detector module 510 can also be operable to generate a peak-to-peak signal 510b indicative of a peak-to-peak value of the difference signal 508a. The peak or threshold detector module 510 can also be operable to generate an offset signal 510c indicative of an offset value of the difference signal 508a.

An automatic gain control module 516 can be coupled to receive the peak-to-peak signal 510b and can be operable to generate a gain control signal 516a to control a gain of the difference circuit 508. An automatic offset adjustment module 514 can be coupled to receive the offset signal 510c and can be operable to generate an offset control signal 514a to control an offset voltage of the difference circuit 508.

The magnetic field sensor 500 can include a window comparator 518 coupled to the vertical Hall element identified with letter E. The window comparator 518 can generate an output inhibit signal 518a. The output inhibit signal 518a can be coupled to one of, or both of, the peak or threshold detector module 510 or the format module 512.

In operation, the vertical Hall element E in combination with the window comparator 518 can identify when the vertical Hall element E senses a magnetic field large enough to put one of or both of the pairs of magnetoresistance elements A, C or B, D into saturation, thereby causing the differential arrangement of the Wheatstone bridge arrangement to function improperly as a differential circuit. Thus, as described above, external or stray magnetic fields may not be canceled by the differential arrangement and the comparison signal 510a may have state changes even when a ring magnet proximate to the magnetic field sensor 500 is not moving. However, operation of the output inhibit signal 518a blanks or otherwise inhibits state transitions of the comparison signal 510a and/or of the output signal 512a when the magnetic field sensed by the vertical Hall element E is large enough to saturate one of, or both of, the pairs of magnetoresistance elements A, C or B, D.

Thresholds of the window comparator 518 can correspond to +/−twenty-five Gauss, +/−thirty Gauss, +/−forty Gauss, +/−fifty Gauss, +/−sixty Gauss, +/−seventy-five Gauss, or +/−one hundred Gauss, experienced by the vertical Hall element E, beyond which the output inhibit signal 518a assumes a first state and within which the output inhibit signal 518a assumes a second different state.

While not shown, in some embodiments, an amplifier can be coupled between the vertical Hall element E and the window comparator 518.

In some embodiments, the magnetic field sensor 500 can include a memory, for example, a non-volatile memory, e.g., an EEPROM, to hold one or more window comparator threshold values. In some embodiments, a signal 522 can provide the one or more window comparator threshold values to the memory 520, for example, from outside of the magnetic field sensor 500 in accordance with one or more of the above-listed ranges of magnetic fields. Selected threshold values 520a can be used by the window comparator 518 depending upon an application in which the magnetic field sensor 500 is used.

In some embodiments, the magnetic field sensor 500 can include a threshold processor 524 coupled to receive a signal 510d from the peak or threshold detector 510 and indicative of a sensed magnetic field. The threshold processor 524 can be operable to use the signal 510d to select an appropriate one of the one or more window comparator threshold values in accordance with the sensed magnetic field. The memory 520 can provide the window comparator threshold value 520a according to a signal 524a generated by the threshold processor.

Saturation of one of or both of the pairs of magnetoresistance elements A, C or B, D can occur in response to magnetic poles of the ring magnet proximate to the magnetic field sensor 500. From FIG. 7 below, it will become apparent that saturation when the ring magnet is not rotating is particularly problematic.

In some other embodiments, the vertical Hall element E can be replaced with a planar Hall element, for example, the planar Hall element 306, F of FIG. 3. In other embodiments, an AMR element can be used. Any magnetic field sensing element that saturates at a substantially higher magnetic field than the magnetoresistance elements A, B, C, D can be used in place of the vertical Hall element E.

Figure 6:
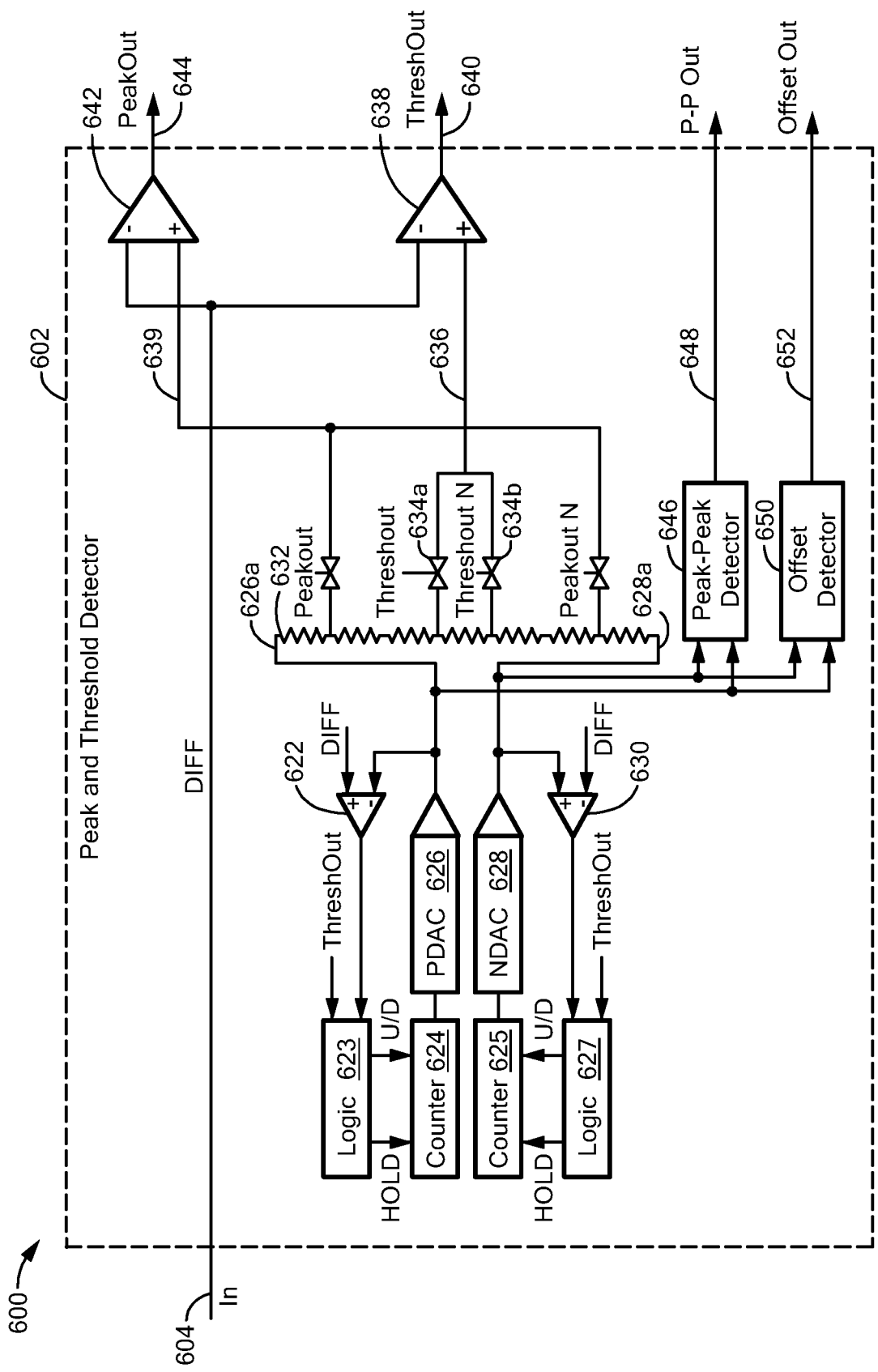
FIG. 6 is a block diagram showing a peak detector and a threshold detector, one of which can be used as the peak or threshold detector of FIG. 5.

Referring now to FIG. 6, a peak and threshold detector module 600 includes both a peak detector module and a threshold detector module. However, the peak or threshold detector module 510 of FIG. 5 needs only one of the modules.

An input signal 604, also referred to as a DIFF signal, can be the same as or similar to the difference signal 508a of FIG. 5.

The input signal 604 is coupled to an input of a peak comparator 642 and to an input of a threshold comparator 638. The peak comparator 642 also receives a threshold voltage 639 and the threshold comparator 138 receives a threshold voltage 636. The peak comparator 642 can be operable to generate a peakout signal 644, which can be a two state signal. The threshold comparator 638 can be operable to generate a threshout signal 640, which can also be a two state signal.

The threshold voltages 636, 639 can be generated by resistor divider 632 coupled to receive a positive peak signal 626a and a negative peak signal 628a, which are representative of held positive and negative peaks of the input signal 604, respectively. Taps of the resistor divider 632 can be received by transmission gates controlled by the peakout signal 644, the threshout signal 640 and inverted signal versions peakout N and threshout N. Thus, the transmission gates toggle back and forth between higher and lower threshold voltages, resulting in a hysteresis effect for the peak comparator 642 and for the threshold comparator 638.

The threshold voltage 639 switches between two values, a first one of which is a first predetermined percentage below a positive peak of a signal 136 and a second one of which is a second predetermined percentage above a negative peak of the input signal 604, determined by taps on resistor divider 632. In one particular embodiment, the first and second predetermined percentages are about ninety percent and about ten percent of the peak-to-peak amplitude of the input signal 604. The threshold voltage 639 can, therefore, be relatively near to and below a positive peak of the input signal 604 or relatively near to and above a negative peak of the input signal 604. Therefore, the peak comparator 642 generates the peakout signal 644 having edges closely associated with the positive and negative peaks of the input signal 604.

The threshold voltage 636 also switches between two values, a first one of which is a first predetermined percentage of the peak-to-peak amplitude of the input signal 604 and a second one of which is a second predetermined percentage of the peak-to-peak amplitude of the input signal 604. In one particular embodiment, the first predetermined percentage is about sixty percent and the second predetermined percentage is about forty percent of the peak-to-peak amplitude of the input signal 604. Therefore, the threshold comparator 638 generates the threshout signal 640 having edges relatively closely associated with the midpoint, or fifty percent point, between the positive peak and the negative peak of the input signal 604.

In some embodiments of the threshold voltage 636, only a fifty percent threshold is used.

The positive peak signal 626a and the negative peak signal 628a are generated by counters 624, 625, logic circuits 623, 627, a positive digital-to-analog converter (PDAC) 626, a negative digital-to-analog converter (NDAC) 628, and comparators 622, 630a. The comparator 622 receives the input signal 604 and the positive peak signal 626a from the PDAC 626, and, by way of feedback provided by the logic circuit 623 and the counter 624, causes the positive peak signal 626a (i.e., the PDAC voltage) to track and hold the positive peaks of the input signal 604. Similarly, the comparator 630 receives the input signal 604 and the negative peak signal 628a from the NDAC 628, and, by way of feedback provided by the logic 627 and the counter 625, causes the negative peak signal 628a (i.e., the NDAC voltage) to track and hold the negative peaks of the input signal 604. Therefore, the differential voltage between the positive peak signal 626a and the negative peak signal 628a represents the peak-to-peak amplitude of the input signal 604.

It should be recognized from the discussion above that the two states of the threshold signal 639 are closely associated with the positive peak and the negative peak of input signal 604, while the two states of the threshold signal 636 are closely associated with a midpoint of the input signal 604.

The peak and threshold detector module 600 can also include a peak-to-peak detector module 646 coupled to receive the positive peak signal 626a and the negative peak signal 628a. The peak-to-peak detector module 646 can be operable to generate a peak-to-peak output signal 648 representative of the peak-to-peak value of the input signal 604. The peak and threshold detector 600 can also include an offset detector module 650 coupled to receive the positive peak signal 626a and the negative peak signal 628a. The offset detector module 650 can be operable to generate an offset output signal 652 representative of an offset value of the input signal 604.

The peak-to-peak signal output 648 can be the same as or similar to the peak-to-peak signal 510b of FIG. 5. The offset output signal 652 can be the same as or similar to the offset signal 510c of FIG. 5. Either the peakout signal 644 or the threshout signal 640 can be the same as or similar to the comparison signal 510a of FIG. 5.

Referring now to FIGS. 7, 8, 9, and 10, graphs 700, 800, 900, 1000 have vertical axes with scales in units of magnetic field in Gauss. The graphs 700, 800, 900, 1000 have horizontal axes with scales in units of time in arbitrary units. However, the horizontal scales could be in other units, for example, degrees of rotation of a target object.

Figure 7:
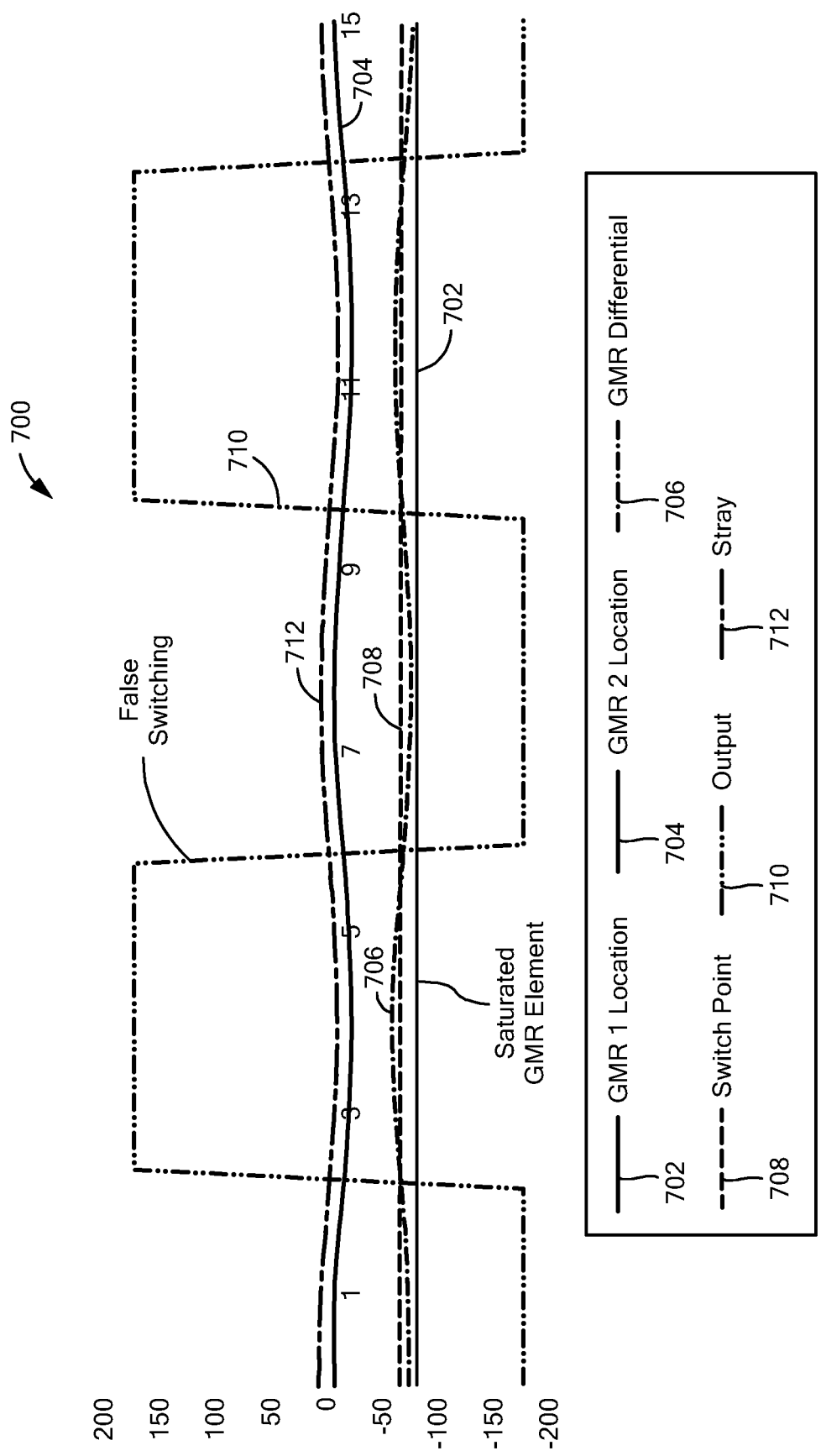
FIG. 7 is a graph showing signals that can be generated within a magnetic field sensor and showing false switching.

Referring now to FIG. 7, a signal 702 is representative of an output signal generated by one pair of magnetoresistance elements in a Wheatstone Bridge a bridge arrangement, e.g., the magnetoresistance elements 204, 206, A and C of FIGS. 2 and 5 when proximate to a stopped ring magnet, stopped at a particular rotation angle. It should be recognized from the signal 702 that the pair of magnetoresistance elements, e.g. 204, 206 are saturated by a magnetic field of about negative seventy-five Gauss.

A signal 704 is representative of an output signal generated by one other pair of magnetoresistance elements in the Wheatstone bridge arrangement, e.g., the magnetoresistance elements 210, 212, B and D of FIGS. 2 and 5 when proximate to the stopped ring magnet, stopped at the particular rotation angle. It should be recognized from the signal 704 that the pair of magnetoresistance elements, e.g. 210, 212 are not saturated by a magnetic field of about zero Gauss.

A stray magnetic field 712, i.e., which can be an AC stray magnetic field (or a DC stray magnetic field not shown), is experienced by the two pairs of magnetoresistance elements 204, 206 and 210, 212. Only one of the pairs of magnetoresistance elements, e.g., 210, 212 shows a response 704 to the stray magnetic field 712, and thus, the four magnetoresistance elements 204, 206, 210, 212 coupled in a bridge arrangement will not generate a proper differential signal, e.g., 504a, 504b of FIG. 5 or a proper difference signal, e.g., 508a of FIG. 5.

A difference signal 706 represents a difference of the two signals 702, 704. It should be understood that, if the two pairs of magnetoresistance elements A, C and B, D generated the same signal, then the difference signal 706 would have no AC content. However, the difference signal 706 has AC content.

The difference signal 706 can be the same as or similar to the difference signal 508a of FIG. 5 or the input or difference signal 604 of FIG. 6.

Since the difference signal 706 has AC content in response to the stray AC magnetic field 712, the peak or threshold detector 510 of FIG. 5 and the peak and threshold detector 600 of FIG. 6, generate a threshold signal 708, here one threshold signal at a fifty percent value of a peak-to-peak range of the difference signal 706. The threshold signal 708 is comparable to the threshold signal 636 of FIG. 6, which can switch between two thresholds near fifty percent of a peak-to-peak value of the difference signal 706, but here shown as one threshold signal 708 at about fifty percent.

Without benefit of the output inhibit signal 514a of FIG. 5, a switching signal 710 (a false switching signal) is generated as the comparison signal 510a of FIG. 5 and as the threshout signal 640 of FIG. 6, even when a ring magnet proximate to the magnetic field sensor 500 is not rotating. However, as understood from discussion above, transitions of the comparison signal 510a and of the threshout signal 640 of FIG. 6 are generated in normal operation when the ring magnet rotates, and a rate of the transitions is indicative of a speed of rotation of the ring magnet proximate to the magnetic field sensor 500 when operated upon by the format module 512. Thus, the transitions of the switching signal 710 (comparison signal 510a of FIG. 5) and or operation of the format module 512. FIG. 5 when the ring magnet proximate to the magnetic field sensor 500 is stopped are highly undesirable. Circuits described above can alleviate this undesirable behavior.

Figure 8:
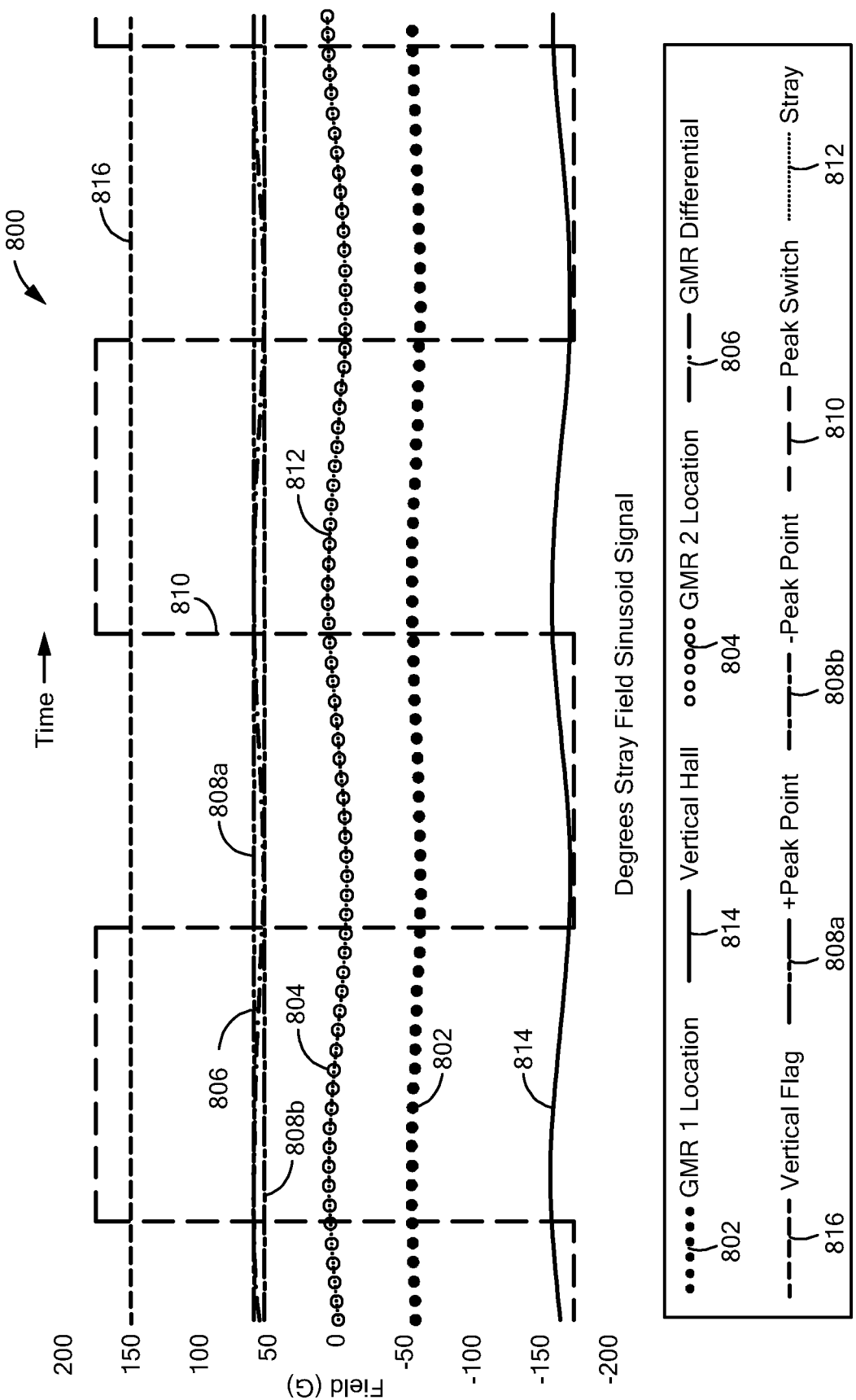
FIG. 8 is a block diagram showing signals that can be generated in the magnetic field sensor of FIG. 5 when a ring magnet proximate to the magnetic field sensor is stopped, and showing operation of a flag signal.
Figure 9:
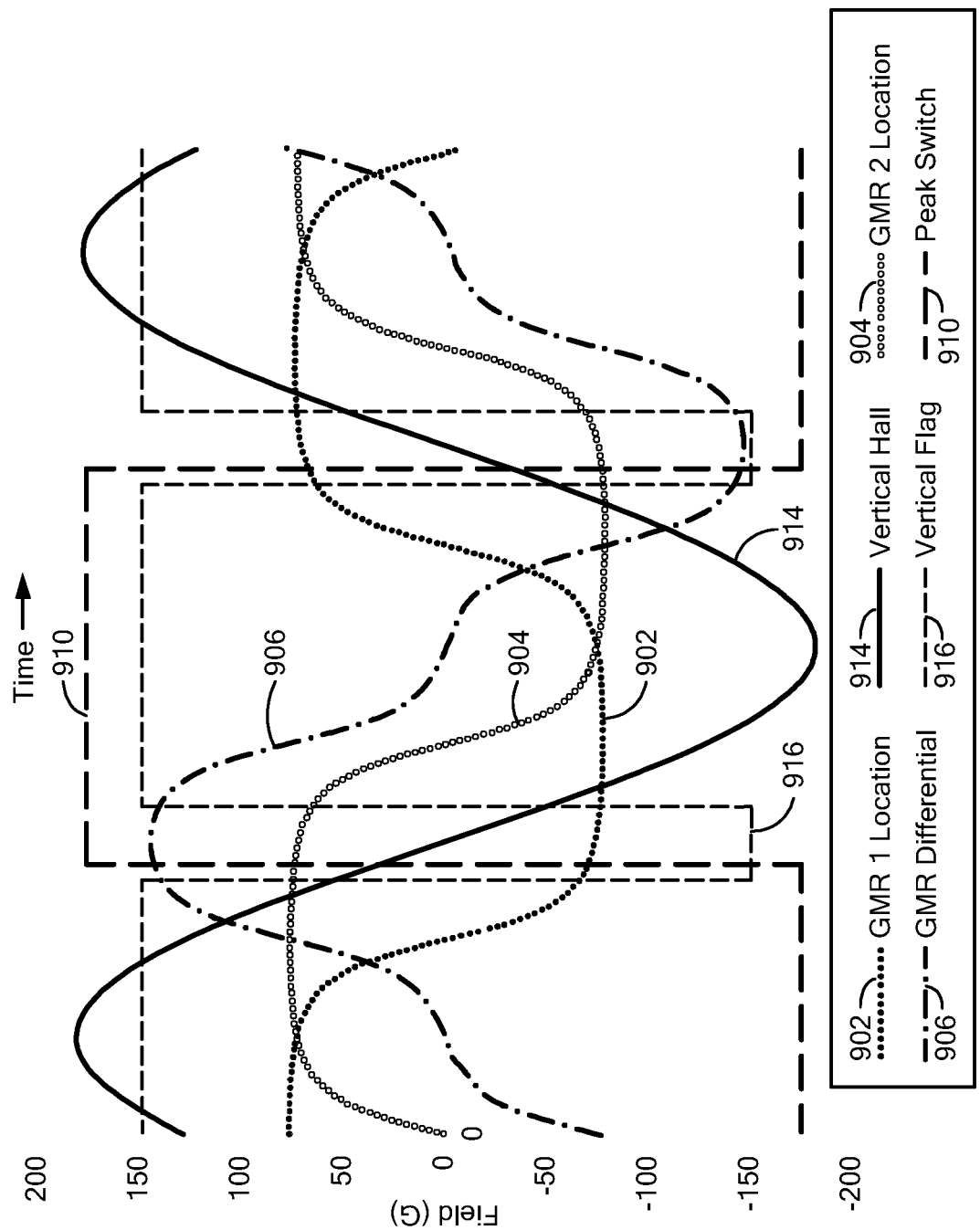
FIG. 9 is a block diagram showing signals that can be generated in the magnetic field sensor of FIG. 5 as a ring magnet proximate to the magnetic field sensor turns, and showing operation of the flag signal.
Figure 10:
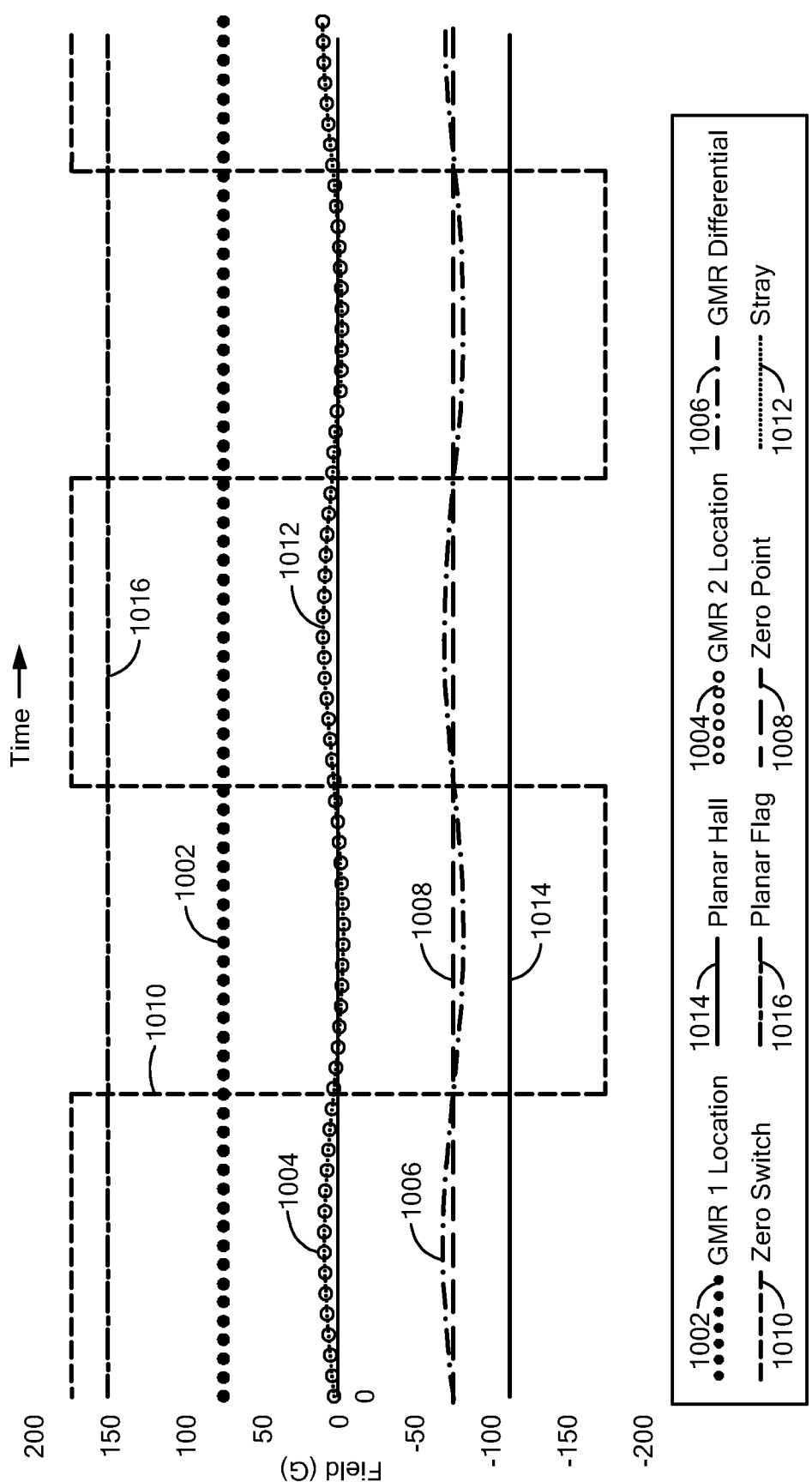
FIG. 10 is a block diagram showing signals that can be generated in a magnetic field sensor of FIG. 5, but having a planar Hall element in place of the vertical Hall element, when a ring magnet proximate to the magnetic field sensor is stopped, and showing operation of a flag signal.
Figure 11:
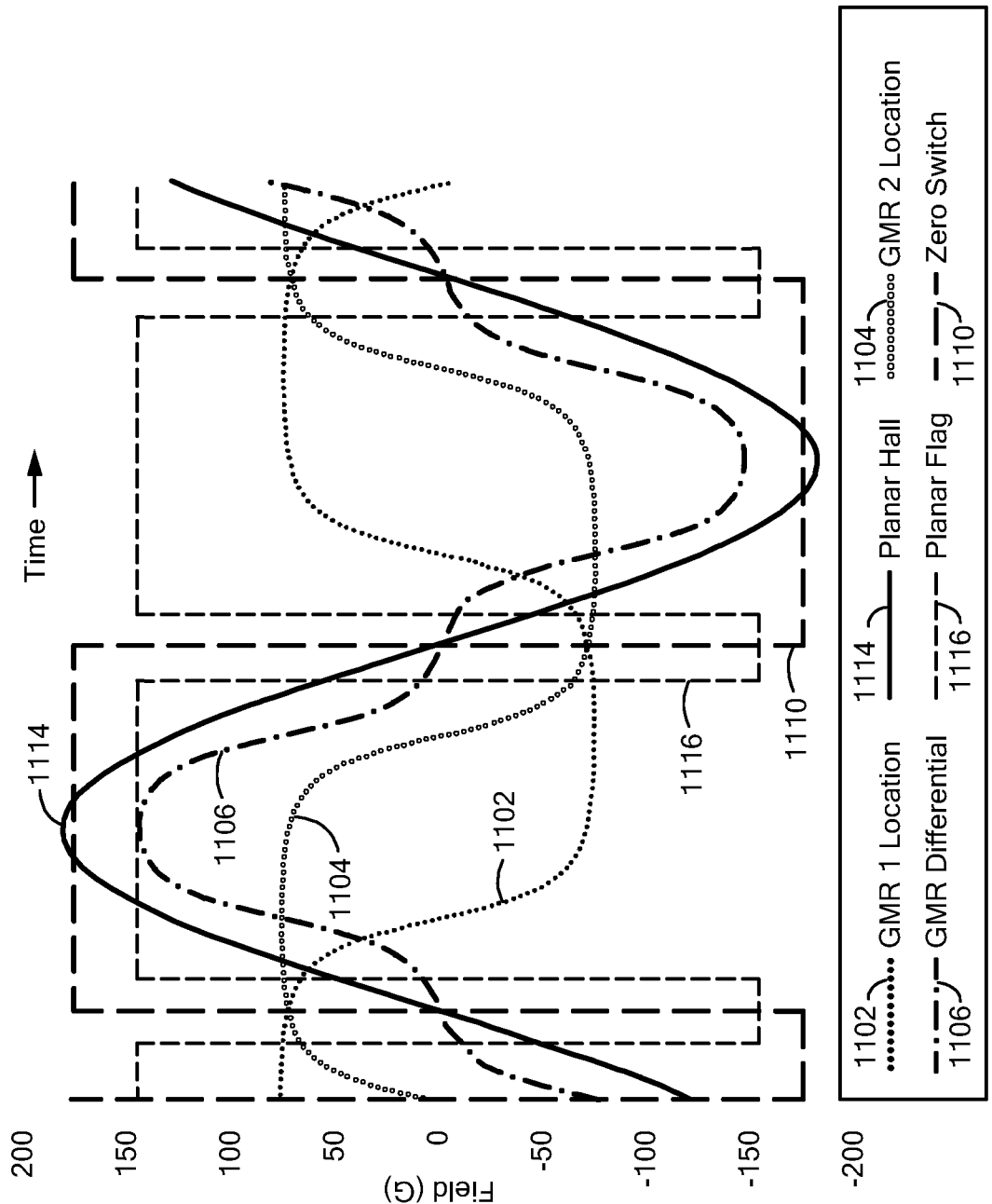
FIG. 11 is a block diagram showing signals that can be generated in a magnetic field sensor of FIG. 5, but having a planar Hall element in place of the vertical Hall element, as a ring magnet proximate to the magnetic field sensor turns, and showing operation of the flag signal.

FIGS. 8 and 9 described below describe a center element E (FIG. 2) as a being vertical Hall element. FIGS. 10 and 11 described below describe a center element F (FIG. 3) as being a planar Hall element. It is described below that neither the vertical Hall element nor the planar Hall element saturate in response to a rotating or stopped ring magnet. However, it should be appreciated that the vertical Hall element E or the planar Hall element F, or a different type of center element, e.g., an AMR element, can saturate in response to the magnet and/or in response to a stray magnet field so long as the magnetic field at which the vertical Hall element, the planar Hall element, or the different type of center element saturate at a substantially higher magnetic field (e.g., one hundred fifty percent or two hundred percent) than the surrounding magnetoresistance elements A, C, B, D of FIGS. 2 and 3.

Referring now to FIG. 8, a signal 802 is representative of an output signal generated by one pair of magnetoresistance elements in a Wheatstone Bridge a bridge arrangement, e.g., the magnetoresistance elements 204, 206, A and C of FIGS. 2 and 5 when proximate to a stopped ring magnet, stopped at a particular rotation angle. It should be recognized from the signal 802 that the pair of magnetoresistance elements, e.g. 204, 206 are nearly saturated by a magnetic field of about negative sixty Gauss, and only a relatively small AC signal is seen in the signal 802. For other positions of the stopped ring magnet, the signal 802 may have less AC content or no AC content.

A signal 804 is representative of an output signal generated by another pair of magnetoresistance elements in the Wheatstone bridge arrangement, e.g., the magnetoresistance elements 210, 212, B and D of FIGS. 2 and 5 when proximate to the stopped ring magnet, stopped at the particular rotation angle. It should be recognized from the signal 804 that the pair of magnetoresistance elements, e.g. 210, 212 are not saturated by a magnetic field of about zero Gauss, and a larger AC signal is seen.

A stray magnetic field 812, i.e., which can be an AC stray magnetic field (but could also be a DC stray magnetic field not shown) is experienced by the two pairs of magnetoresistance elements 204, 206 and 210, 212. Only one of the pairs of magnetoresistance elements, e.g., 210, 212 shows a full response 804 to the stray magnetic field 812. Thus, the stray field signal 812 is the same as signal 804 experienced by the pair of magnetic field sensing elements, e.g., 210, 212.

A difference signal 806 represents a difference of the two signals 802, 804. It should be understood that, if the two pairs of magnetoresistance elements A, C and B, D generated the same signal, then the difference signal 806 would have no AC content. However, the difference signal 806 has AC content.

The difference signal 806 can be the same as or similar to the difference signal 508a of FIG. 5 or the input or difference signal 604 of FIG. 6.

Since the difference signal 806 has AC content in response to the stray AC magnetic field 812, the peak or threshold detector 510 of FIG. 5 and the peak and threshold detector 600 of FIG. 6 generate two threshold signals 808a, 808b, for example, at ninety percent and ten percent of a peak-to-peak value of the difference signal 806. The threshold signals 808a, 808b can be comparable to the threshold signal 639 of FIG. 6, which switches between two peak-reference thresholds, for example, at ten percent and ninety percent or a peak-to-peak value of the difference signal 806.

A vertical Hall signal 814, a DC signal, is generated by the vertical Hall element E of FIGS. 2 and 5. The vertical Hall element E is not saturated in response to the stray magnetic field 812. The vertical Hall element is seen to be generating a signal representative of a magnetic field that is always outside of a window threshold, for example, outside of +/− fifty Gauss (see window comparator 514 of FIG. 5). Therefore, an output inhibit signal (i.e., flag) 816, which can be the same as or similar to the output inhibit signal 514a of FIG. 5, can achieve a state, e.g., a high state, that can cause the peak or threshold detector module 510 and/or the format module 512 to be inhibited by operation of the output inhibit signal 816 for this stopped condition of the ring magnet proximate to the magnetic field sensor 500. If the peak or threshold detector module 510 is inhibited, then a switching signal 810 that would be generated by the peak or threshold detector module 510 does not switch, in which case the signal 810 is shown only for descriptive purposes.

In some embodiments that do not inhibit the peak or threshold detector module 510 of FIG. 5 but instead inhibit only the format module 512, the switching signal 810 can still be generated as the comparison signal 510a of FIG. 5 and as the peakout signal 644 of FIG. 6, even when a ring magnet proximate to the magnetic field sensor 500 is not rotating. As understood from discussion above, transitions of the switching signal 810, e.g., the comparison signal 510a and the peakout signal 644 are generated in normal operation, and a rate of the transitions is indicative of a speed of rotation of the ring magnet proximate to the magnetic field sensor 500. As described above, when the ring magnet proximate to the magnetic field sensor 500 is stopped, it is desirable either to inhibit the switching signal 810 (510a of FIG. 5. 644 of FIG. 6) and/or to inhibit the format module 512 of FIG. 5. Thus, in some embodiments, the switching signal 810 is inhibited by operation of the output inhibit signal 816 and in other embodiments for which the format module 512 is inhibited, the switching signal 810 may not be inhibited, but instead the format module 512 does not propagate the switching signal 810.

Referring now to FIG. 9, a signal 902 is representative of an output signal generated by one pair of magnetoresistance elements in a Wheatstone bridge arrangement, e.g., the magnetoresistance elements 204, 206, A and C of FIGS. 2 and 5 when proximate to a rotating ring magnet. It should be recognized from the signal 902 that the pair of magnetoresistance elements, e.g. 204, 206 are saturated by a magnetic field of about +/− seventy-five Gauss at some times, and at other times, the pair of magnetoresistance elements, e.g. 204, 206, i.e., the signal 902, are not saturated.

A signal 904 is representative of an output signal generated by one other pair of magnetoresistance elements in the Wheatstone bridge arrangement, e.g., the magnetoresistance elements 210, 212, B and D of FIGS. 2 and 5 when proximate to the rotating ring magnet. It should be recognized from the signal 904 that the pair of magnetoresistance elements, e.g. 210, 212 are saturated by a magnetic field of about +/− seventy-five Gauss at some times, and at other times, the pair of magnetoresistance elements, e.g. 210, 212, i.e., the signal 904, are not saturated.

Assuming that AC magnetic field resulting from the rotating ring magnet at positions of the pairs of magnetoresistance elements is much larger that a stray magnetic field, a stray magnetic field is not shown.

A difference signal 906 represents a difference of the two signals 902, 904. It should be understood that, if the two pairs of magnetoresistance elements A, C and B, D generated the same signal, then the difference signal 906 would have no AC content. However, the difference signal 906 has AC content.

The difference signal 906 can be the same as or similar to the difference signal 508a of FIG. 5 or the input or difference signal 604 of FIG. 6.

Since the difference signal 906 has AC content in response to the rotating ring magnet, the peak or threshold detector 510 of FIG. 5 and the peak and threshold detector 600 of FIG. 6 generate two threshold signals (not shown), for example, at ninety percent and ten percent of a peak-to-peak value of the difference signal 906. The threshold signals are comparable to the threshold signal 639 of FIG. 6, which switches between two peak-referenced thresholds, for example, at ten percent and ninety percent of a peak-to-peak value of the difference signal 906.

A vertical Hall signal 914, an AC signal, is generated by the vertical Hall element E of FIGS. 2 and 5 as the ring magnet rotates. The vertical Hall element E may not be saturated in response to the magnetic field as the ring magnet rotates. However, in other embodiments, the vertical Hall element F can be saturated in response to the ring magnet and/or in response to a stray field, but at a higher field than the field that saturates either one of the signals 902, 904 generated by the magnetoresistance elements. The vertical Hall element E can generate the vertical Hall signal 914 representative of a magnetic field that is sometimes within a threshold window, for example, within about +/− fifty Gauss (see window comparator 514 of FIG. 5) and sometimes outside of the threshold window. Therefore, an output inhibit signal (i.e., flag) 916, which can be the same as or similar to the output inhibit signal 514a of FIG. 5, can achieve alternating states, e.g., high and low states, wherein the high states state (when the vertical Hall signal 914 is outside of the window) can cause the peak or threshold detector module 510 and/or the format module 512 to be inhibited by operation of the output inhibit signal 916 (514a of FIG. 5) as the ring magnet rotates, and during low states of the output inhibit signal 916 state (when the planar Hall signal 914 is inside of the window), the peak or threshold detector module 510 and/or the format module 512 can operate normally to generate a switching signal 910.

Assuming thresholds of ten percent and ninety percent of the difference signal 906, the switching signal 910 can be generated as the comparison signal 510a of FIG. 5 and as the peakout signal 644 of FIG. 6 (as opposed to the threshout signal 640), while the ring magnet rotates. Note that the switching signal can switch while the output inhibit signal 916 is in the low state. Also note that the output inhibit signal 916 is in the low state while both of the signals 902, 904 are out of saturation, i.e., when the difference signal is being properly generated as a differential signal with reduced influence from stray magnetic fields.

As understood from discussion above, transitions of the switching signal 910, e.g., the comparison signal 510a and the peakout signal 644 are generated in normal operation, and a rate of the transitions is indicative of a speed of rotation of the ring magnet proximate to the magnetic field sensor 500.

In other embodiments similar to the embodiments of FIGS. 8 and 9, instead of peak-referenced threshold, for example, at ten percent and ninety percent of a peak-to-peak value of the difference signals 806, 906, respectively, other thresholds can be used, for example, forty percent and sixty percent or only fifty percent.

Referring now to FIG. 10, a signal 1002 is representative of an output signal generated by one pair of magnetoresistance elements in a Wheatstone Bridge a bridge arrangement, e.g., the magnetoresistance elements 204, 206, A and C of FIGS. 2 and 5 when proximate to a stopped ring magnet, stopped at a particular rotation angle. It should be recognized from the signal 1002 that the pair of magnetoresistance elements, e.g. 204, 206 are saturated by a magnetic field of about positive seventy-five Gauss, and only DC component is seen in the signal 1002.

A signal 1004 is representative of an output signal generated by another pair of magnetoresistance elements in the Wheatstone bridge arrangement, e.g., the magnetoresistance elements 210, 212, B and D of FIGS. 2 and 5 when proximate to the stopped ring magnet, stopped at the particular rotation angle. It should be recognized from the signal 1004 that the pair of magnetoresistance elements, e.g. 210, 212 are not saturated by a magnetic field of about zero Gauss, and an AC component is seen.

A stray magnetic field 1012, i.e., which can be an AC stray magnetic field (but could also be a DC stray magnetic field not shown) is experienced by the two pairs of magnetoresistance elements 204, 206 and 210, 212. Only one of the pairs of magnetoresistance elements, e.g., 210, 212 shows a full response 1004 to the stray magnetic field 1012. Thus, the stray field signal 1012 is the same as signal 1004 experienced by the pair of magnetic field sensing elements, e.g., 210, 212.

A difference signal 1006 represents a difference of the two signals 1002, 1004. It should be understood that, if the two pairs of magnetoresistance elements A, C and B, D generated the same signal, then the difference signal 1006 would have no AC content. However, the difference signal 1006 has AC content.

The difference signal 1006 can be the same as or similar to the difference signal 508a of FIG. 5 or the input or difference signal 604 of FIG. 6.

Since the difference signal 1006 has AC content in response to the stray AC magnetic field 1012, the peak or threshold detector 510 of FIG. 5 and the peak and threshold detector module 600 of FIG. 6 generate one or more thresholds 1008, for example, at fifty percent of a peak-to-peak value of the difference signal 1006. A threshold signal 1008 is comparable to the threshold signal 636 of FIG. 6, which switches between two thresholds near zero, for example, both thresholds at about fifty percent of a peak-to-peak value of the difference signal 1006.

A planar Hall signal 1014, a DC signal, is generated by the planar Hall element F of FIG. 3. The planar Hall elements F is not saturated in response to the stray magnetic field 1012. The planar Hall element F is seen to be generating a signal representative of a magnetic field that is always outside of a window threshold, for example, outside of +/− fifty Gauss (see window comparator 514 of FIG. 5). Therefore, an output inhibit signal (i.e., flag) 1016, which can be the same as or similar to the output inhibit signal 514a of FIG. 5, can achieve a state, e.g., a high state, that can cause the peak or threshold detector module 510 and/or the format module 512 to be inhibited by operation of the output inhibit signal 1016 for this stopped condition of the ring magnet proximate to the magnetic field sensor 500. If the peak or threshold detector module 510 is inhibited, then a switching signal 1010 that would be generated by the peak or threshold detector module 510 does not switch, in which case the signal 1010 is shown only for descriptive purposes.

In some embodiments that do not inhibit the peak or threshold detector module 510 of FIG. 5 but instead inhibit only the format module 512, the switching signal 1010 can still be generated as the comparison signal 510a of FIG. 5 and as the peakout signal 644 of FIG. 6, even when a ring magnet proximate to the magnetic field sensor 500 is not rotating. As understood from discussion above, transitions of the switching signal 1010, e.g., the comparison signal 510a and the peakout signal 644 are generated in normal operation, and a rate of the transitions is indicative of a speed of rotation of the ring magnet proximate to the magnetic field sensor 500. As described above, when the ring magnet proximate to the magnetic field sensor 500 is stopped, it is desirable either to inhibit the switching signal 1010 (510a of FIG. 5) and/or to inhibit the format module 512 of FIG. 5. Thus, in some embodiments, the switching signal 1010 is inhibited by operation of the output inhibit signal 1016 and in other embodiments for which the format module 512 is inhibited, the switching signal 1010 may not be inhibited, but instead the format module 512 does not propagate the switching signal 1010.

Referring now to FIG. 11, a signal 1102 is representative of an output signal generated by one pair of magnetoresistance elements in a Wheatstone bridge arrangement, e.g., the magnetoresistance elements 204, 206, A and C of FIGS. 2 and 5 when proximate to a rotating ring magnet. It should be recognized from the signal 1102 that the pair of magnetoresistance elements, e.g. 204, 206, i.e., the signal 1102, are saturated by a magnetic field of about +/− seventy-five Gauss at some times, and at other times, the pair of magnetoresistance elements, e.g., 204, 206, i.e., the signal 1102, are not saturated.

A signal 1104 is representative of an output signal generated by one other pair of magnetoresistance elements in the Wheatstone bridge arrangement, e.g., the magnetoresistance elements 210, 212, B and D of FIGS. 2 and 5 when proximate to the rotating ring magnet. It should be recognized from the signal 1104 that the pair of magnetoresistance elements, e.g. 210, 212, i.e., the signal 1104, are saturated by a magnetic field of about +/− seventy-five Gauss at some times (saturation beginning above about +/− fifty Gauss), and at other times, the pair of magnetoresistance elements, e.g. 210, 212, i.e., the signal 1104, are not saturated.

Assuming that AC magnetic field resulting from the rotating ring magnet at positions of the pairs of magnetoresistance elements is much larger that a stray magnetic field, a stray magnetic field is not shown.

A difference signal 1106 represents a difference of the two signals 1102, 1104. It should be understood that, if the two pairs of magnetoresistance elements A, C and B, D generated the same signal, then the difference signal 1106 would have no AC content. However, the difference signal 1106 has AC content.

The difference signal 1106 can be the same as or similar to the difference signal 508a of FIG. 5 or the input or difference signal 604 of FIG. 6.

Since the difference signal 1106 has AC content in response to the rotating ring magnet, the peak or threshold detector 510 of FIG. 5 and the peak and threshold detector 600 of FIG. 6 generate at least one threshold signal (not shown), for example, at fifty percent of a peak-to-peak value of the difference signal 1106. The threshold signal is comparable to the threshold signal 636 of FIG. 6, which switches between two peak-referenced thresholds, for example, at forty percent and sixty percent of a peak-to-peak value of the difference signal 1106, but is here indicated as one threshold at fifty percent.

A planar Hall signal 1114, an AC signal, is generated by the planar Hall element F of FIG. 3 as the ring magnet rotates. The planar Hall element F may not bet saturated in response to a proximate rotating ring magnet. However, in other embodiments, the planar Hall element F can be saturated in response to the ring magnet and/or in response to a stray field, but at a higher field than the field that saturates either one of the signals 1102, 1104 generated by the magnetoresistance elements. The planar Hall element F can generate a signal 1114 representative of a magnetic field that is sometimes within a threshold window, for example, within about +/− fifty Gauss (see window comparator 514 of FIG. 5) and sometimes outside of the threshold window. Therefore, an output inhibit signal (i.e., flag) 1116, which can be the same as or similar to the output inhibit signal 514a of FIG. 5, can achieve alternating states, e.g., high and low states, wherein the high state (when the planar Hall signal 1114 is outside of the window) can cause the peak or threshold detector module 510 and/or the format module 512 to be inhibited by operation of the output inhibit signal 1116 (514a of FIG. 5) as the ring magnet rotates, and during low states of the output inhibit signal 1116 state (when the planar Hall signal 1114 is inside the window), the peak or threshold detector module 510 and/or the format module 512 can operate normally.

Assuming the above-described threshold at fifty percent of the peak to peak value of the difference signal 1106, a switching signal 1110 can be generated as the comparison signal 510a of FIG. 5 and as the threshout signal 640 (as opposed to the peakout signal 644) of FIG. 6, while the ring magnet rotates. Note that the switching signal 1110 can switch while the output inhibit signal 1116 is in the low state. Also note that the output inhibit signal 1116 is in the low state while both of the signals 1102, 1104 are out of saturation, i.e., when the difference signal 1104 is being properly generated as a differential signal with reduced influence by stray magnetic fields.

As understood from discussion above, transitions of the switching signal 1110, e.g., the comparison signal 510a and the threshout signal 640 are generated in normal operation, and a rate of the transitions is indicative of a speed of rotation of the ring magnet proximate to the magnetic field sensor 500.

In other embodiments similar to the embodiments of FIGS. 10 and 11, instead of zero-referenced thresholds, for example, at forty percent and sixty percent (or just fifty percent) of a peak-to-peak value of the difference signals 806, 1106, respectively, other thresholds can be used, for example, ten percent and ninety percent.

In conjunction with figures above, for example, FIG. 5, it is described that one difference signal, e.g., difference signal 508a is generated. However, in other embodiments described below, two difference signals in two separate circuit channels can be generated using the same four magnetoresistance elements 204, 206, 210, 212 of FIGS. 2 and 3.

Figure 12:
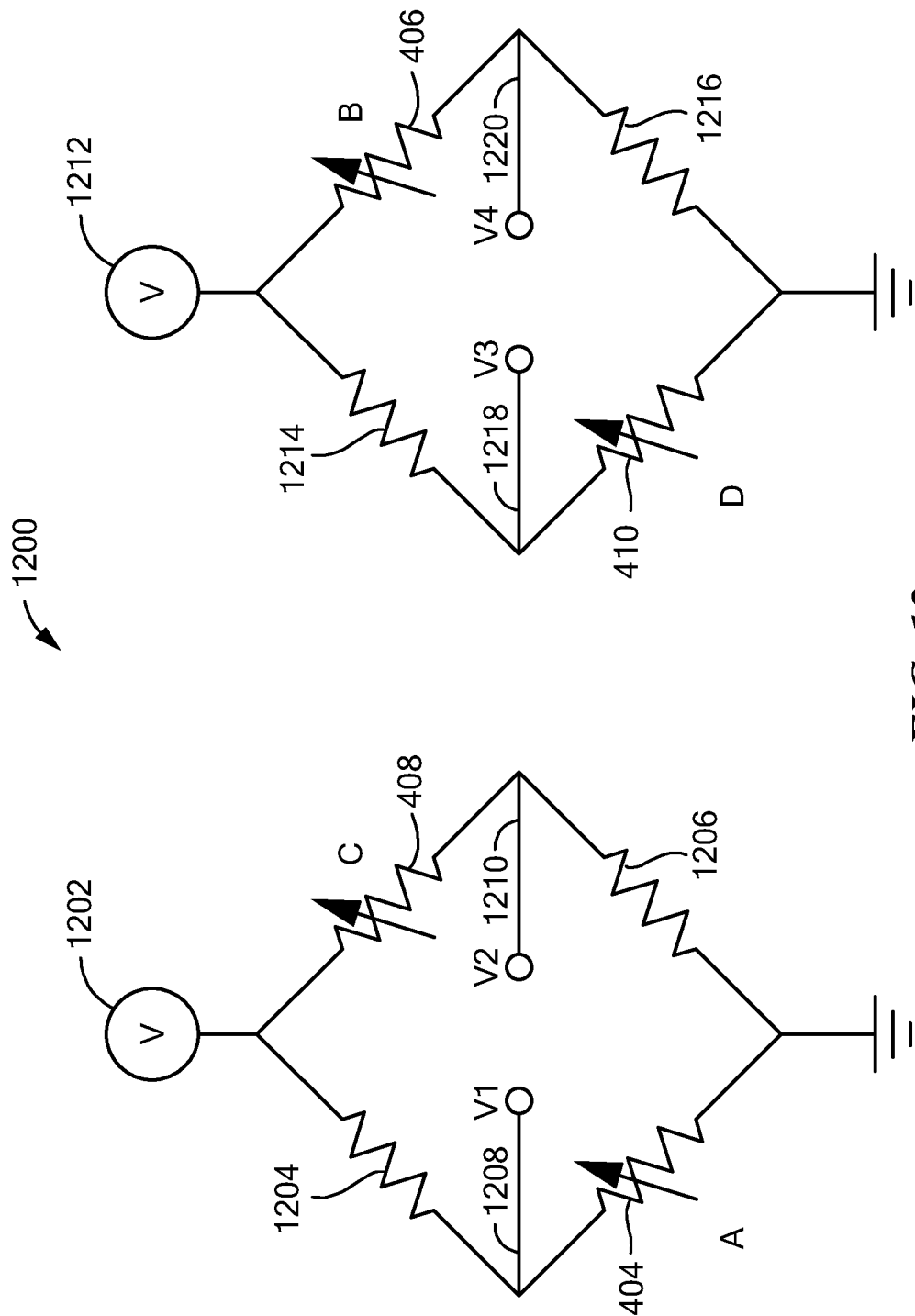
FIG. 12 is a block diagram showing an alternate coupling of four magnetoresistance elements to achieve two signal channels.

Referring now to FIG. 12, in which like elements of FIGS. 2, 3, and 4 are shown having like reference designations, the two magnetoresistance elements 404, 408, A and C can be coupled with two fixed resistors 1204, 1206 in a Wheatstone bridge arrangement to generate a first differential signal 1208, 1210, V1 and V2. Similarly, the two magnetoresistance elements 410, 406, D and B can be coupled with two fixed resistors 1214, 1216 in another Wheatstone bridge arrangement to generate a second differential signal 1218, 1220, V3 and V4.

In other embodiments, two half bridges or two simple magnetoresistance elements can be used in place of the two full bridges.

The two Wheatstone bridge arrangements can each be coupled to difference circuits the same as or similar to difference circuit 508 of FIG. 5 and two separate circuit channels can each have the other components of FIG. 5. However, in some embodiments, there is only one format module like the format module 502, but which receives signals from two peak or threshold detector modules.

An advantage of using the two circuit channels is that a resulting magnetic field sensor can generate an output signal representative of not only a speed of rotation of a ring magnet, but also a direction of rotation of the ring magnet. Direction information can be determined based upon a sign of a relative phase (plus or minus) of the two difference signals, because the magnetoresistance elements A, C and the magnetoresistance elements B, D are physically separated and experience different phases of magnetic field as the ring magnet rotates.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor responsive to a magnet operable to move in a predetermined movement and operable to stop moving, comprising:
   a substrate;
   a first magnetic field sensing element formed upon the substrate, the first magnetic field sensing element comprising a first magnetoresistance element, the first magnetic field sensing element responsive to the magnet;
   a second magnetic field sensing element formed upon the substrate, the second magnetic field sensing element comprising a second magnetoresistance element, the second magnetic field sensing element responsive to the magnet, wherein, at one or more positions of the magnet relative to the first and second magnetic field sensing elements while the magnet is stopped moving, at least one of the first magnetic field sensing element or the second magnetic field sensing element is in saturation in response to the magnet;
   a third magnetic field sensing element formed upon the substrate and proximate to the first and second magnetoresistance elements, the third magnetic field sensing element operable to generate a third magnetic field sensing element signal responsive to the magnet, wherein, at the one or more positions while the magnet is stopped moving, the third magnetic field sensing element is not in saturation in response to the magnet or saturates at a higher magnetic field than the first and second magnetic field sensing elements in response to the magnet; and
   a window comparison circuit coupled to the third magnetic field sensing element, the window comparison circuit responsive to an upper threshold value and a lower threshold value, the window comparison circuit operable to generate an inhibit signal with a first inhibit state indicative of the third magnetic field sensing element signal being outside of a window between the upper threshold value and the lower threshold value and a second inhibit state indicative of the third magnetic field sensing element signal being within the window.

2. The magnetic field sensor of claim 1, further comprising:
   a difference circuit coupled to the first and second magnetic field sensing elements, the difference circuit operable to generate a difference signal related to a difference of magnetic responses of the first and second magnetic field sensing elements, wherein the difference circuit comprises an analog circuit or a digital circuit.

3. The magnetic field sensor of claim 1, wherein the first and second magnetic field sensing elements are coupled within a bridge circuit, the bridge circuit operable to generate a differential signal related to magnetic responses of the first and second magnetic field sensing elements, the first magnetic field sensing element and the second magnetic field sensing element affecting the differential signal in opposite directions in response to a common magnetic field.

4. The magnetic field sensor of claim 3, wherein the third magnetic field sensing element comprises a selected one of a planar Hall element, a vertical Hall element, or an AMR element.

5. The magnetic field sensor of claim 1, further comprising:
   a difference circuit coupled to the first and second magnetic field sensing elements, the difference circuit operable to generate a difference signal related to a difference of magnetic responses of the first and second magnetic field sensing elements, wherein the difference circuit comprises an analog circuit or a digital circuit;
   a detector circuit coupled to the difference circuit and operable to compare the difference signal with one or more detector threshold values, and operable to generate, in response to the comparing, a two state detector signal, the two state detector signal having a first detector state when the difference signal is above the one or more detector threshold values and a second detector state different than the first detector state when the difference signal is below the one or more detector threshold values, wherein a signal related to the two state detector signal is inhibited by the first inhibit state generated by the window comparison circuit.

6. The magnetic field sensor of claim 1, wherein the upper threshold is representative of a magnetic field of about fifty Gauss experienced by the third magnetic field sensing element and the lower threshold is representative of a magnetic field of about negative fifty Gauss experienced by the third magnetic field sensing element.

7. The magnetic field sensor of claim 1, wherein the upper threshold is representative of a magnetic field between about twenty-five Gauss and about one hundred Gauss experienced by the third magnetic field sensing element and the lower threshold is representative of a magnetic field between about negative twenty-five Gauss and about negative one hundred Gauss experienced by the third magnetic field sensing element.

8. The magnetic field sensor of claim 1, wherein the third magnetic field sensing element comprises a planar Hall element.

9. The magnetic field sensor of claim 1, wherein the third magnetic field sensing element comprises a vertical Hall element.

10. The magnetic field sensor of claim 1, wherein the third magnetic field sensing element comprises an AMR element.

11. The magnetic field sensor of claim 1, wherein the window comparison circuit is within a processor.

12. A method used in a magnetic field sensor responsive to a magnet operable to move in a predetermined movement and operable to stop moving, comprising:
   forming a first magnetic field sensing element upon a substrate, the first magnetic field sensing element comprising a first magnetoresistance element, the first magnetic field sensing element responsive to the magnet;
   forming a second magnetic field sensing element upon the substrate, the second magnetic field sensing element comprising a second magnetoresistance element, the second magnetic field sensing element responsive to the magnet, wherein, at one or more positions of the magnet relative to the first and second magnetic field sensing elements while the magnet is stopped moving, at least one of the first magnetic field sensing element or the second magnetic field sensing element is in saturation in response to the magnet;
   forming a third magnetic field sensing element upon the substrate and proximate to the first and second magnetoresistance elements;
   generating a third magnetic field sensing element signal responsive to the magnet with the third magnetic field sensing element, wherein, at the one or more positions while the magnet is stopped moving, the third magnetic field sensing element is not in saturation in response to the magnet or saturates at a higher magnetic field than the first and second magnetic field sensing elements in response to the magnet; and
   generating an inhibit signal with a first inhibit state indicative of the third magnetic field sensing element signal being outside of a window between an upper threshold value and a lower threshold value and a second inhibit state indicative of the third magnetic field sensing element signal being within the window.

13. The method of claim 12, further comprising:
   coupling a difference circuit to the first and second magnetic field sensing elements; and
   generating, with the difference circuit, a difference signal related to a difference of magnetic responses of the first and second magnetic field sensing elements, wherein the difference circuit is an analog circuit or a digital circuit.

14. The method of claim 12, wherein the first and second magnetic field sensing elements are coupled within a bridge circuit, the method further comprising:
   generating, with the bridge circuit, a differential signal related to magnetic responses of the first and second magnetic field sensing elements, the first magnetic field sensing element and the second magnetic field sensing element affecting the differential signal in opposite directions in response to a common magnetic field.

15. The method of claim 14, wherein the third magnetic field sensing element comprises a selected one of a planar Hall element, a vertical Hall element, or an AMR element.

16. The method of claim 12, further comprising:
   coupling a difference circuit to the first and second magnetic field sensing elements;
   generating, with the difference circuit, a difference signal related to a difference of magnetic responses of the first and second magnetic field sensing elements, wherein the difference circuit is an analog circuit or a digital circuit;
   comparing the difference signal with one or more detector threshold values; and
   generating, in response to the comparing, a two state detector signal, the two state detector signal having a first detector state when the difference signal is above the one or more detector threshold values and a second detector state different than the first detector state when the difference signal is below the one or more detector threshold values, wherein a signal related to the two state detector signal is inhibited by the first inhibit state.

17. The method of claim 12, wherein the upper threshold is representative of a magnetic field of about fifty Gauss experienced by the third magnetic field sensing element and the lower threshold is representative of a magnetic field of about negative fifty Gauss experienced by the third magnetic field sensing element.

18. The method of claim 12, wherein the upper threshold is representative of a magnetic field between about twenty-five Gauss and about one hundred Gauss experienced by the third magnetic field sensing element and the lower threshold is representative of a magnetic field between about negative twenty-five Gauss and about negative one hundred Gauss experienced by the third magnetic field sensing element.

19. The method of claim 12, wherein the third magnetic field sensing element comprises a planar Hall element.

20. The method of claim 12, wherein the third magnetic field sensing element comprises a vertical Hall element.

21. The method of claim 12, wherein the third magnetic field sensing element comprises an AMR element.

22. The method of claim 12, wherein generating the inhibit signal comprises using a processor to generate the inhibit signal.

23. A magnetic field sensor responsive to a magnet operable to move, comprising:
   means for generating a first magnetic field sensing element signal responsive to the magnet with a first magnetic field sensing element, the first magnetic field sensing element comprising a first magnetoresistance element;
   means for generating a second magnetic field sensing element signal responsive to the magnet with a second magnetic field sensing element, the second magnetic field sensing element comprising a second magnetoresistance element, wherein, at one or more positions of the magnet relative to the first and second magnetic field sensing elements while the magnet is stopped moving, at least one of the first magnetic field sensing element or the second magnetic field sensing element is in saturation in response to the magnet;
   means for generating a third magnetic field sensing element signal responsive to the magnet with a third magnetic field sensing element, wherein, at the one or more positions, the third magnetic field sensing element is not in saturation in response to the magnet or saturates at a higher magnetic field than the first and second magnetic field sensing elements in response to the magnet; and
   means for generating an inhibit signal with a first inhibit state indicative of the third magnetic field sensing element signal being outside of a window between an upper threshold value and a lower threshold value and a second inhibit state indicative of the third magnetic field sensing element signal being within the window.

24. The magnetic field sensor of claim 23, further comprising:
   means for generating a difference signal related to magnetic responses of the first and second magnetic field sensing elements.

25. The magnetic field sensor of claim 22, further comprising:
   means for generating a difference signal related to a difference of magnetic responses of the first and second magnetic field sensing elements, the first magnetic field sensing element and the second magnetic field sensing element affecting the difference signal in opposite directions in response to a common magnetic field.

26. The magnetic field sensor of claim 25, wherein the third magnetic field sensing element comprises a selected one of a planar Hall element, a vertical Hall element, or an AMR element.

27. The magnetic field sensor of claim 23, further comprising:
   means for generating a difference signal related to magnetic responses of the first and second magnetic field sensing elements;
   means for generating a two state detector signal having a first detector state when the difference signal is above one or more detector threshold values and a second detector state different than the first detector state when the difference signal is below the one or more detector threshold values, wherein a signal related to the two state detector signal is inhibited by the first inhibit state.

28. The magnetic field sensor of claim 23, wherein the upper threshold is representative of a magnetic field of about fifty Gauss experienced by the third magnetic field sensing element and the lower threshold is representative of a magnetic field of about negative fifty Gauss experienced by the third magnetic field sensing element.

29. The magnetic field sensor of claim 23, wherein the upper threshold is representative of a magnetic field between about twenty-five Gauss and about one hundred Gauss experienced by the third magnetic field sensing element and the lower threshold is representative of a magnetic field between about negative twenty-five Gauss and about negative one hundred Gauss experienced by the third magnetic field sensing element.

30. The magnetic field sensor of claim 23, wherein the third magnetic field sensing element comprises a planar Hall element.

31. The magnetic field sensor of claim 23, wherein the third magnetic field sensing element comprises a vertical Hall element.

32. The magnetic field sensor of claim 23, wherein the third magnetic field sensing element comprises an AMR element.

33. The magnetic field sensor of claim 23, wherein the inhibit signal generating means comprises a processor.

* * * * *

UNITED STATES PATENT AND TRADEMARK OFFICE
CERTIFICATE OF CORRECTION

PATENT NO. : 10,976,183 B2
APPLICATION NO. : 16/522810
DATED : April 13, 2021
INVENTOR(S) : Paul A. David et al.

Page 1 of 2

It is certified that error appears in the above-identified patent and that said Letters Patent is hereby corrected as shown below:

On the Title Page

Item (57) Abstract, Line 1 delete "substrate first" and replace with --substrate and first--.

Item (57) Abstract, Line 5 delete "At or more" and replace with --At one or more--.

In the Specification

Column 1, Line 67 delete "element" and replace with --elements--.

Column 2, Line 10 delete "allowed" and replace with --allowing--.

Column 2, Lines 30-31 delete "magnet the" and replace with --magnet and the--.

Column 4, Line 21 delete "for" and replace with --four--.

Column 6, Line 36-37 delete "value above" and replace with --value being above--.

Column 7, Lines 15-16 delete "the four magnetoresistance elements magnetoresistance elements" and replace with --the four magnetoresistance elements--.

Column 7, Line 17 delete "208, 210" and replace with --210, 212--.

Column 8, Line 8 delete "208, 210" and replace with --210, 212--.

Column 8, Line 64 delete "one of" and replace with --one or--.

Column 10, Line 40 delete "138" and replace with --638--.

Column 10, Line 59 delete "136" and replace with --636--.

Signed and Sealed this
Seventeenth Day of May, 2022

Katherine Kelly Vidal
*Director of the United States Patent and Trademark Office*

Column 11, Line 32 delete "logic 627" and replace with --logic circuit 627--.

Column 12, Line 3 delete "Wheatstone Bridge a bridge arrangement," and replace with --Wheatstone Bridge arrangement,--.

Column 12, Line 61 delete "512. FIG. 5" and replace with --512 of FIG. 5--.

Column 12, Line 66 delete "as a being" and replace with --as being a--.

Column 13, Line 16 delete "Wheatstone Bridge a bridge arrangement," and replace with --Wheatstone Bridge arrangement,--.

Column 14, Line 28 delete "FIG. 5. 644" and replace with --FIG. 5, 644--.

Column 14, Line 55 delete "that AC" and replace with --that an AC--.

Column 15, Line 28 delete "states state" and replace with --states--.

Column 15, Lines 62-63 delete "Wheatstone Bridge a bridge arrangement," and replace with --Wheatstone Bridge arrangement,--.

Column 16, Line 1 delete "only DC" and replace with --only a DC--.

Column 16, Line 41 delete "elements" and replace with --element--.

Column 17, Line 34 delete "that AC" and replace with --that an AC--.

Column 17, Line 60 delete "bet" and replace with --be--.

Column 18, Line 17 delete "threshold at" and replace with --threshold is at--.

In the Claims

Column 22, Line 64 delete "claim 22," and replace with --claim 23,--.